(12) United States Patent
Kim et al.

(10) Patent No.: US 11,682,171 B2
(45) Date of Patent: Jun. 20, 2023

(54) METHOD AND APPARATUS FOR ACQUIRING VIRTUAL OBJECT DATA IN AUGMENTED REALITY

(71) Applicant: SAMSUNG ELECTRONICS CO., LTD., Suwon-si (KR)

(72) Inventors: Seokyeol Kim, Suwon-si (KR); Sangjun Ahn, Suwon-si (KR); Haekyung Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/862,730

(22) Filed: Apr. 30, 2020

(65) Prior Publication Data
US 2020/0380771 A1     Dec. 3, 2020

Related U.S. Application Data

(60) Provisional application No. 62/854,533, filed on May 30, 2019.

(30) Foreign Application Priority Data

Oct. 2, 2019   (KR) ........................ 10-2019-0122508

(51) Int. Cl.
*G06T 17/20*      (2006.01)
*G06T 15/50*      (2011.01)
(Continued)

(52) U.S. Cl.
CPC .............. *G06T 17/20* (2013.01); *G06F 30/12* (2020.01); *G06F 30/17* (2020.01); *G06T 15/506* (2013.01);
(Continued)

(58) Field of Classification Search
CPC ..... G06T 15/506; G06T 19/006; G06T 19/20; G06T 15/20; G06T 15/60; G06T 2215/12;
(Continued)

(56) References Cited

U.S. PATENT DOCUMENTS 5,710,875 A * 1/1998 Harashima .............. G06T 15/10
    345/419
5,977,978 A * 11/1999 Carey ..................... G06T 19/00
    345/419
(Continued)

FOREIGN PATENT DOCUMENTS

JP      2009-53870 A    3/2009
KR    10-2016-0006087 A    1/2016
(Continued)

OTHER PUBLICATIONS

Anonymous, "Polygon mesh", Wikipedia, last edited on Mar. 29, 2020, https://en.wikipedia.org/wiki/Polygon_mesh. (13 pages total).
(Continued)

*Primary Examiner* — Charles L Beard
(74) *Attorney, Agent, or Firm* — Sughrue Mion, PLLC

(57) ABSTRACT

Provided are a method and apparatus for acquiring virtual object data in augmented reality, the method including identifying at least one exposed component from three-dimensional image data corresponding to a target device, the exposed component being exposed to a view from outside of the target device, identifying a type of the target device from the three-dimensional image data corresponding to the target device, determining at least one main direction of the target device based on the type of the target device, and acquiring virtual object data for representing an appearance of the target device based on the at least one exposed component and at least one main direction.

23 Claims, 12 Drawing Sheets

(51) Int. Cl.
  *G06T 19/20* (2011.01)
  *G06F 30/12* (2020.01)
  *G06F 30/17* (2020.01)
  *G06T 19/00* (2011.01)
  *G06V 20/00* (2022.01)

(52) U.S. Cl.
  CPC ............ *G06T 19/006* (2013.01); *G06T 19/20* (2013.01); *G06V 20/00* (2022.01)

(58) Field of Classification Search
  CPC ......... G06T 17/20; G06F 30/12; G06F 30/17; G06V 20/00
  See application file for complete search history.

(56) References Cited

U.S. PATENT DOCUMENTS

| | | | | |
|---|---|---|---|---|
| 6,781,597 | B1* | 8/2004 | Vrobel | G06T 19/20 715/848 |
| 7,079,990 | B2* | 7/2006 | Haller | G06T 19/20 703/2 |
| 7,856,343 | B2* | 12/2010 | Jo | G06F 30/00 345/418 |
| 7,969,435 | B1* | 6/2011 | DeSimone | G06T 17/00 703/2 |
| 8,089,478 | B2* | 1/2012 | Hariya | G06T 17/20 345/419 |
| 8,126,260 | B2* | 2/2012 | Wallack | G06V 10/24 382/154 |
| 8,830,225 | B1* | 9/2014 | Karakotsios | G06F 16/954 345/419 |
| 9,047,706 | B1* | 6/2015 | Ogale | G06T 15/20 |
| 9,094,670 | B1* | 7/2015 | Furio | G06T 19/20 |
| 9,418,629 | B2* | 8/2016 | Calian | G06T 19/006 |
| 9,508,152 | B2* | 11/2016 | Yoo | G06T 15/08 |
| 10,051,600 | B1* | 8/2018 | Zhong | H04L 67/12 |
| 10,109,055 | B2* | 10/2018 | Xu | G06K 9/6269 |
| 10,235,797 | B1* | 3/2019 | Sheffield | G06T 7/0002 |
| 10,311,630 | B2* | 6/2019 | Gervasio | G06T 15/20 |
| 10,339,721 | B1* | 7/2019 | Dascola | G06T 7/80 |
| 10,438,262 | B1* | 10/2019 | Helmer | G06V 10/255 |
| 10,482,674 | B1* | 11/2019 | Wu | G09B 25/00 |
| 10,529,134 | B2* | 1/2020 | Abe | A63F 13/92 |
| 10,559,121 | B1* | 2/2020 | Moudgil | G06T 15/50 |
| 10,573,067 | B1* | 2/2020 | Naik | G06V 10/28 |
| 10,586,390 | B2* | 3/2020 | Han | G06F 1/1686 |
| 10,636,148 | B1* | 4/2020 | Chen | G06T 7/194 |
| 10,665,011 | B1* | 5/2020 | Sunkavalli | G06T 19/006 |
| 10,706,321 | B1* | 7/2020 | Chen | G06V 20/64 |
| 10,769,718 | B1* | 9/2020 | Nunn | G06T 17/00 |
| 10,825,247 | B1* | 11/2020 | Vincent | G06T 17/05 |
| 10,885,701 | B1* | 1/2021 | Patel | A63F 13/57 |
| 10,922,877 | B2* | 2/2021 | Mitchell | G06T 17/00 |
| 10,943,404 | B2* | 3/2021 | Yoon | H04M 1/72454 |
| 10,944,960 | B2* | 3/2021 | Matsunobu | H04N 13/117 |
| 10,948,725 | B2* | 3/2021 | Bak | G06F 3/012 |
| 11,107,292 | B1* | 8/2021 | Little | G09B 5/02 |
| 11,120,639 | B1* | 9/2021 | Smith | G06F 3/011 |
| 11,417,069 | B1* | 8/2022 | Gupta | G06V 20/70 |
| 2002/0050988 | A1* | 5/2002 | Petrov | G06V 10/10 345/418 |
| 2002/0085046 | A1* | 7/2002 | Furuta | G06T 15/20 715/848 |
| 2003/0034974 | A1* | 2/2003 | Welch | G06T 15/50 345/589 |
| 2003/0034976 | A1* | 2/2003 | Raskar | G06T 15/005 345/630 |
| 2003/0038822 | A1* | 2/2003 | Raskar | G01B 11/2504 345/632 |
| 2003/0043152 | A1* | 3/2003 | Raskar | G06T 13/20 345/473 |
| 2003/0052890 | A1* | 3/2003 | Raskar | G06T 15/503 345/581 |
| 2003/0090526 | A1* | 5/2003 | Nishigaki | G06Q 10/04 715/810 |
| 2003/0107568 | A1* | 6/2003 | Urisaka | G06T 17/00 345/419 |
| 2003/0137506 | A1* | 7/2003 | Efran | H04N 5/2627 345/419 |
| 2004/0194273 | A1* | 10/2004 | Yamakado | B09B 5/00 29/403.3 |
| 2004/0213915 | A1* | 10/2004 | Andersen | G05B 19/40931 118/667 |
| 2004/0215360 | A1* | 10/2004 | Yamakado | G06Q 10/06 700/95 |
| 2005/0002571 | A1* | 1/2005 | Hiraga | G06V 10/426 382/218 |
| 2005/0184997 | A1* | 8/2005 | Lake | G06T 15/02 345/582 |
| 2007/0279414 | A1* | 12/2007 | Vandenbrande | G06T 7/33 345/420 |
| 2009/0187385 | A1 | 7/2009 | Zegdoun et al. | |
| 2009/0262113 | A1* | 10/2009 | Kotake | G02B 27/017 345/427 |
| 2010/0201684 | A1* | 8/2010 | Yadav | G06T 19/00 715/764 |
| 2012/0032958 | A1* | 2/2012 | Werline | G06T 19/20 345/419 |
| 2012/0092528 | A1* | 4/2012 | Jung | H04N 1/00244 348/E5.051 |
| 2013/0095924 | A1* | 4/2013 | Geisner | A63F 13/21 463/32 |
| 2013/0120357 | A1* | 5/2013 | Joshi | G06T 19/20 345/419 |
| 2013/0301875 | A1* | 11/2013 | Schumacher | G06F 3/011 382/103 |
| 2014/0225922 | A1* | 8/2014 | Sbardella | G06T 19/20 345/633 |
| 2014/0267253 | A1* | 9/2014 | Lipp | G06T 17/20 345/420 |
| 2014/0267407 | A1* | 9/2014 | Mullins | G06T 15/20 345/633 |
| 2014/0368621 | A1* | 12/2014 | Michiyama | G06T 7/75 348/50 |
| 2015/0287203 | A1* | 10/2015 | Baumberg | G06T 7/73 382/103 |
| 2015/0302116 | A1* | 10/2015 | Howell | G06T 15/06 703/1 |
| 2016/0029007 | A1* | 1/2016 | Kim | H04N 5/23216 348/49 |
| 2016/0189433 | A1* | 6/2016 | Dayde | G06T 17/10 345/419 |
| 2016/0313902 | A1* | 10/2016 | Hill | G06V 20/64 |
| 2016/0323565 | A1* | 11/2016 | van Baarsen | H04N 5/77 |
| 2017/0006215 | A1* | 1/2017 | Leung | H04N 23/64 |
| 2017/0243352 | A1* | 8/2017 | Kutliroff | G06T 7/10 |
| 2017/0249726 | A1* | 8/2017 | Rochford | G06V 10/143 |
| 2017/0278308 | A1* | 9/2017 | Bleiweiss | G06V 20/647 |
| 2018/0050273 | A1* | 2/2018 | Garoufalis | G07F 17/3286 |
| 2018/0054487 | A1* | 2/2018 | Hebsur | H04L 41/0806 |
| 2018/0061086 | A1* | 3/2018 | Yoshimura | G06T 7/74 |
| 2018/0101813 | A1* | 4/2018 | Paat | G06Q 10/087 |
| 2018/0107896 | A1* | 4/2018 | Sagong | G06V 10/462 |
| 2018/0144458 | A1* | 5/2018 | Xu | H04N 13/204 |
| 2018/0144550 | A1* | 5/2018 | Vaxman | G06T 17/20 |
| 2018/0150791 | A1* | 5/2018 | Stansell | G06T 19/006 |
| 2018/0165881 | A1* | 6/2018 | Pohl | G06F 3/011 |
| 2018/0247393 | A1* | 8/2018 | Ohga | G06T 15/205 |
| 2018/0308281 | A1* | 10/2018 | Okoyama | G06T 7/11 |
| 2018/0350133 | A1* | 12/2018 | Gervasio | H04N 21/816 |
| 2018/0350134 | A1* | 12/2018 | Lodato | G06T 15/20 |
| 2018/0350135 | A1* | 12/2018 | Castaneda | G06T 19/20 |
| 2018/0365898 | A1* | 12/2018 | Costa | G02B 27/0172 |
| 2019/0004684 | A1* | 1/2019 | Pahud | G06T 19/20 |
| 2019/0034056 | A1* | 1/2019 | Eisenmann | G06T 19/20 |
| 2019/0042832 | A1* | 2/2019 | Venshtain | H04L 65/70 |
| 2019/0051050 | A1* | 2/2019 | Bell | G06T 15/20 |
| 2019/0051054 | A1* | 2/2019 | Jovanovic | G01S 17/89 |
| 2019/0087976 | A1* | 3/2019 | Sugahara | G06V 20/64 |
| 2019/0096135 | A1* | 3/2019 | Dal Mutto | G06T 19/006 |

(56) References Cited

U.S. PATENT DOCUMENTS

| | | | |
|---|---|---|---|
| 2019/0147658 A1* | 5/2019 | Kurabayashi | G06T 15/506 345/423 |
| 2019/0164055 A1* | 5/2019 | Ljung Larhed | G06N 3/084 |
| 2019/0206141 A1* | 7/2019 | Deng | G06V 40/172 |
| 2019/0213778 A1* | 7/2019 | Du | G06T 17/00 |
| 2019/0236531 A1* | 8/2019 | Adato | G08B 21/182 |
| 2019/0279417 A1* | 9/2019 | Castaneda | G06T 15/20 |
| 2019/0311533 A1* | 10/2019 | Doh | G01C 11/04 |
| 2019/0340649 A1* | 11/2019 | Ayush | G06F 18/2132 |
| 2019/0364265 A1* | 11/2019 | Matsunobu | H04N 21/21805 |
| 2019/0378204 A1* | 12/2019 | Ayush | G06Q 30/0643 |
| 2020/0019142 A1* | 1/2020 | Ulu | G05B 19/4099 |
| 2020/0038119 A1* | 2/2020 | Geri | G09G 3/002 |
| 2020/0041261 A1* | 2/2020 | Bernstein | A61B 1/0605 |
| 2020/0045298 A1* | 2/2020 | Kneale | G06T 15/506 |
| 2020/0089954 A1* | 3/2020 | Zia | G06V 20/64 |
| 2020/0111267 A1* | 4/2020 | Stauber | G02B 27/017 |
| 2020/0134911 A1* | 4/2020 | van Hoff | G06T 7/292 |
| 2020/0145644 A1* | 5/2020 | Cordes | H04N 23/698 |
| 2020/0160616 A1* | 5/2020 | Li | G06T 7/33 |
| 2020/0167970 A1* | 5/2020 | Kim | G06V 10/761 |
| 2020/0175771 A1 | 6/2020 | Lee et al. | |
| 2020/0257245 A1* | 8/2020 | Linville | G03H 1/2249 |
| 2020/0258144 A1* | 8/2020 | Chaturvedi | G06T 7/50 |
| 2020/0273247 A1* | 8/2020 | Lim | G06T 15/20 |
| 2020/0312042 A1* | 10/2020 | Sardari | A63F 13/216 |
| 2020/0322596 A1* | 10/2020 | Kim | G06F 3/013 |
| 2020/0327719 A1* | 10/2020 | Mason | G06T 17/10 |
| 2020/0374498 A1* | 11/2020 | Sodhi | G01B 11/2518 |
| 2020/0410754 A1* | 12/2020 | Sugano | G06T 15/04 |
| 2021/0019036 A1* | 1/2021 | Wang | G06F 3/0346 |
| 2021/0035332 A1* | 2/2021 | Cho | H04N 23/64 |
| 2021/0042948 A1* | 2/2021 | Morimoto | G06T 7/90 |
| 2021/0065430 A1* | 3/2021 | Le Floch | G06T 7/596 |
| 2021/0074068 A1* | 3/2021 | Spivack | G06F 3/011 |
| 2021/0081698 A1* | 3/2021 | Lindeman | G06T 7/0006 |
| 2021/0097776 A1* | 4/2021 | Faulkner | G06F 1/1686 |
| 2021/0103776 A1* | 4/2021 | Jiang | G06T 15/20 |
| 2021/0133850 A1* | 5/2021 | Ayush | G06V 10/945 |
| 2021/0133929 A1* | 5/2021 | Ackerson | G06T 3/4092 |
| 2021/0134049 A1* | 5/2021 | Sugano | H04N 13/243 |
| 2021/0152389 A1* | 5/2021 | Park | H04L 12/282 |
| 2021/0166477 A1* | 6/2021 | Bunkasem | G06V 10/776 |
| 2021/0255611 A1* | 8/2021 | McGregor | G06F 3/011 |
| 2021/0291768 A1* | 9/2021 | Balasubramanian | B60R 21/0132 |
| 2021/0295594 A1* | 9/2021 | Sinha | G06T 17/00 |
| 2021/0333979 A1* | 10/2021 | Rockel | G06T 7/70 |
| 2021/0383115 A1* | 12/2021 | Alon | A63F 13/355 |
| 2021/0400195 A1* | 12/2021 | Adato | G06Q 10/087 |
| 2022/0005276 A1* | 1/2022 | Morisawa | G06T 5/50 |
| 2022/0067984 A1* | 3/2022 | Choi | A63F 13/92 |
| 2022/0084279 A1* | 3/2022 | Lindmeier | G06T 19/20 |
| 2022/0091837 A1* | 3/2022 | Chai | G06F 8/36 |
| 2022/0092757 A1* | 3/2022 | Zhou | G06T 7/194 |
| 2022/0146617 A1* | 5/2022 | Nakagawa | G01S 3/7864 |
| 2022/0301257 A1* | 9/2022 | Garbin | G06N 3/08 |

FOREIGN PATENT DOCUMENTS

| | | |
|---|---|---|
| KR | 10-1595303 B1 | 2/2016 |
| WO | 2017/177019 A1 | 10/2017 |

OTHER PUBLICATIONS

Communication (PCT/ISA/220, PCT/ISA/210 and PCT/ISA/237) dated Jul. 15, 2020 by the International Searching Authority in counterpart International Patent Application No. PCT/KR2020/005051.

Kanai et al., "Appearance preserving simplification of 3D CAD model with large-scale assembly structures", 2012, International Journal on Interactive Design and Manufacturing, XP 035092273, 19 pages total.

Danglade, et al., "Estimation of CAD model simplification impact on CFD analysis using machine learning techniques", 2015, CAD Conference, XP 55863797, 5 pages total.

Communication dated Nov. 30, 2021 by the European Patent Office for European Patent Application No. 20814507.8.

* cited by examiner

| COMPONENT NAME | WHETHER TO CONTACT RAY PROJECTED FROM EACH DIRECTION | | | | | | PROCESSING RESULT |
|---|---|---|---|---|---|---|---|
| | 1 | 2 | 3 | 4 | ... | N | |
| Door | X | O | O | X | | X | MAINTAINED |
| Front panel | X | O | O | X | | X | MAINTAINED |
| Right panel | X | X | X | O | | X | MAINTAINED |
| Top panel | X | X | X | X | | O | MAINTAINED |
| Motor | X | X | X | X | | X | REMOVED |
| Left panel | O | X | X | X | | X | MAINTAINED |

METHOD AND APPARATUS FOR ACQUIRING VIRTUAL OBJECT DATA IN AUGMENTED REALITY

CROSS-REFERENCE TO RELATED APPLICATIONS

This application is based on and claims the benefit of U.S. Provisional Patent Application No. 62/854,533, filed on May 30, 2019, in the United States Patent and Trademark Office, and claims priority under 35 U.S.C § 119 to Korean Patent Application No. 10-2019-0122508, filed on Oct. 2, 2019, in the Korean Intellectual Property Office, the disclosures of which are incorporated herein by reference in their entirety.

BACKGROUND

1. Field

The disclosure relates to a technique for acquiring virtual object data in augmented reality. In more detail, the disclosure relates to a technique for acquiring virtual object data from three-dimensional image data of an object.

2. Description of Related Art

With the development of digital technology, various electronic devices such as mobile communication terminals, personal digital assistants (PDAs), electronic notebooks, smart phones, tablet personal computers (PCs), or wearable devices have been widely distributed. These and other electronic devices may provide a user with various sensory experiences. For example, an electronic device may provide a user with augmented reality (AR) in which virtual information is added to a real object.

Augmented reality is a technological field that provides a new paradigm that may be used in human-computer interaction and communication. Augmented reality is one of the virtual realities and combines the real world that a user sees with a virtual world having additional information on one image. Augmented reality is a concept complementing the real world with a virtual world and uses a virtual environment generated by computer graphics, but may be also based on the real environment.

In order to provide the user with augmented reality, three-dimensional graphics technology may be used. In order to make the user feel as if there are various objects in the virtual world, three-dimensional appearance data for each object and an application capable of visually implementing the three-dimensional appearance data may be used.

According to the related art, in order to visually implement a preset object in a virtual world in augmented reality, a method of directly and manually creating and generating three-dimensional appearance data of each object by a user has been used. Such a three-dimensional appearance data generation method has low efficiency of generating data due to allowing the user to manually implement the appearance of each object for a long time.

Accordingly, a method of efficiently acquiring three-dimensional appearance data of various objects in augmented reality is demanded.

SUMMARY

Provided are an apparatus and method for effectively providing virtual object data in augmented reality.

Additional aspects will be set forth in part in the description which follows and, in part, will be apparent from the description, or may be learned by practice of the presented embodiments of the disclosure.

According to an aspect of the disclosure, there is provided a method of acquiring virtual object data in augmented reality, the method comprising: identifying at least one component of a target device from three-dimensional image data corresponding to the target device, the at least one component being exposed to a view from outside of the target device; identifying a type of the target device from the three-dimensional image data corresponding to the target device; identifying a first direction of the target device based on the type of the target device; and acquiring virtual object data for representing an appearance of the target device based on the at least one component and the first direction.

The three-dimensional image data may comprise computer-aided design (CAD) data.

The identifying the at least one component of the target device may comprise: arranging the target device and at least one virtual light source in a virtual space, based on the three-dimensional image data; and identifying a component reached by light emitted from the at least one virtual light source, from among a plurality of components included in the target device, as the at least one component.

The identifying the component reached by light emitted from the at least one virtual light source, from among the plurality of components included in the target device, as the at least one component may comprise: rotating the at least one virtual light source about a virtual line passing through the target device as a central axis; and identifying a component reached by the light emitted from the at least one virtual light source while the at least one virtual light source is rotating, from among the plurality to components included in the target device, as the at least one component.

The identifying of the component reached by light emitted from the at least one virtual light source, from among the plurality of components included in the target device, as the at least one component may comprise: moving a component that is movable from among the plurality of components included in the target device; and identifying the component reached by the light emitted from the at least one virtual light source while the other component is moved, from among the plurality of components included in the target device, as the at least one component.

The method may further comprise setting a component weight corresponding to the at least one component, wherein the acquiring of the virtual object data for presenting the appearance of the target device comprises identifying a size of the virtual object data based on at least one of the at least one component or the set component weight.

The identifying of the first direction of the target device based on the type of the target device may comprise: obtaining a database including information about a preset type of the target device and a main direction corresponding to the preset type of the target device; matching the preset type of the target device in the database with the identified type of the target device; and identifying the first direction of the target device based on a result of the matching.

The method may further comprise setting a direction weight corresponding to the first direction, wherein the acquiring of the virtual object data for presenting the appearance of the target device comprises determining a size of the virtual object data based on the direction weight.

The first direction of the target device may be defined based on a three-dimensional coordinate system set in a virtual space.

The three-dimensional image data may be acquired from a network including a cloud.

According to another aspect of the disclosure, there is provided an electronic device for acquiring virtual object data in augmented reality, the electronic device comprising: a memory storing one or more instructions; and a processor configured to execute the one or more instructions to: identify at least one component of a target device from three-dimensional image data corresponding to the target device, the at least one component being exposed to a view from outside of the target device, identify a type of the target device from the three-dimensional image data corresponding to the target device, identify a first direction of the target device based on the identified type of the target device, and acquire virtual object data for representing an appearance of the target device based on the at least one component and the first direction.

The three-dimensional image data may comprise computer-aided design (CAD) data.

The processor may be further configured to execute the one or more instructions to: arrange the target device and at least one virtual light source in a virtual space based on the three-dimensional image data, and identify a component reached by light emitted from the at least one virtual light source, from among a plurality of components included in the target device, as the at least one component.

The processor may be further configured to execute the one or more instructions to: rotate the at least one virtual light source about a virtual line passing through the target device as a central axis, and identify the component reached by the light emitted from the at least one virtual light source while the at least one virtual light source is rotating, from among the plurality of components included in the target device, as the at least one component.

The processor may be further configured to execute the one or more instructions to: move another component that is movable from among the plurality of components included in the target device, and identify the component reached by the light emitted from the at least one virtual light source reaches while other component is moved, as the at least one component, from among the plurality of components included in the target device.

The processor may be further configured to execute the one or more instructions to: set a component weight corresponding to the at least one component, and identify a size of the virtual object data based on the at least one component and the set component weight.

The processor may be further configured to execute the one or more instructions to: obtain a database including information about a preset type of the target device and a main direction corresponding to the preset type of the target device, match the preset type of the target device included in the database with the identified type of the target device, and identify the first direction of the target device based on a result of the matching.

The processor may be further configured to execute the one or more instructions to: set a direction weight corresponding to the first direction, and determine a size of the virtual object data based on the direction weight.

The first direction of the target device may be defined based on a three-dimensional coordinate system set in a virtual space.

According to another aspect of the disclosure, there is provided a computer-readable recording medium having recorded thereon a program for executing, on a computer, a method of acquiring virtual object data in augmented reality, wherein the method comprises: identifying at least one component of a target device from three-dimensional image data corresponding to the target device, the at least one component being exposed to a view from outside of the target device; identifying a type of the target device from the three-dimensional image data corresponding to the target device; identifying a first direction of the target device based on the type of the target device; and acquiring virtual object data for representing an appearance of the target device based on the at least one component and the first direction.

BRIEF DESCRIPTION OF THE DRAWINGS

The above and other aspects, features, and advantages of certain embodiments of the disclosure will be more apparent from the following description taken in conjunction with the accompanying drawings, in which.

The above and other features and advantages will become more apparent by describing in detail exemplary embodiments thereof with reference to the attached drawings in which reference numerals mean structural elements.

DETAILED DESCRIPTION

Figure 1:
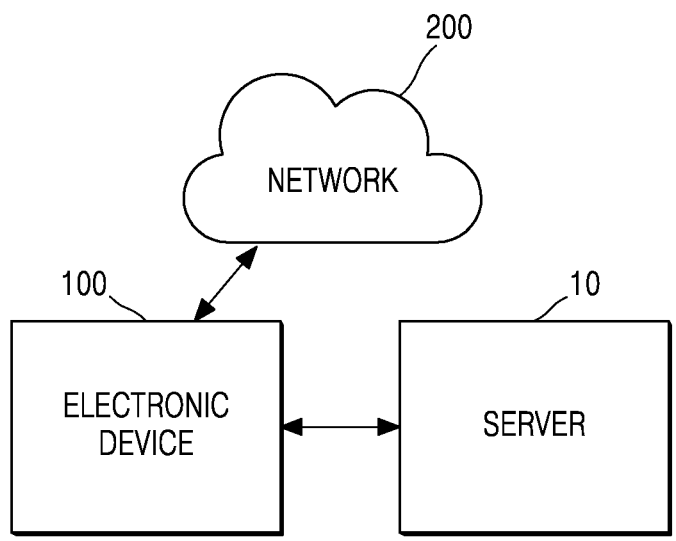
FIG. 1 is a block diagram of an electronic device according to an embodiment of the disclosure.

Hereinafter, one or more embodiments of the disclosure will be described in detail with reference to accompanying drawings to the extent that one of ordinary skill in the art would be able to carry out the disclosure. However, the disclosure may be implemented in various manners, and is not limited to one or more embodiments of the disclosure described herein. In addition, components irrelevant with the description are omitted in the drawings for clear description, and like reference numerals are used for similar components throughout the entire specification.

Throughout the disclosure, the expression "at least one of a, b or c" indicates only a, only b, only c, both a and b, both a and c, both b and c, all of a, b, and c, or variations thereof.

One or more embodiments of the disclosure may be represented as functional block structures, various processing stages and/or various processing operations. Some or all of the functional blocks may be realized by any number of hardware and/or software components configured to perform the specified functions.

For example, the functional blocks of the disclosure may be realized by one or more microprocessors or circuit structures for performing a preset function.

In addition, for example, the functional blocks of the disclosure may be implemented with any programming or scripting language. The functional blocks may be implemented in algorithms that are executed on one or more processors.

Also, the disclosure may employ any number of techniques according to the related art for electronics configuration, signal processing and/or, data processing and the like.

In addition, the connecting lines, or connectors shown in the various figures presented are intended to represent exemplary functional relationships and/or physical or circuit couplings between the various elements. It should be noted that connections between elements by many alternative or additional functional relationships, physical connections or circuit connections may be present in a practical device.

In addition, the terms such as "unit", "module", etc. provided herein indicates a unit performing at least one function or operation, and may be realized by hardware, software, or a combination of hardware and software. "Unit" and "module" may be stored in a storage medium that may be addressed and may be realized by a program that is executable by a processor.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, when the device in the figures is turned over, elements described as "below" or "beneath" other elements or features would then be oriented "above" the other elements or features. Thus, the term "above" may encompass both an orientation of above and below. The device may be otherwise oriented (rotated 90 degrees at other orientations) and the spatially relative descriptors used herein interpreted accordingly.

The terminology used herein is for the purpose of describing particular embodiments and is not intended to limit the disclosure. It will be evident to those of skill in the art that various implementations based on the technical spirit of the disclosure are possible in addition to the disclosed embodiments. Further, when necessary, the above respective embodiments may be employed in combination. For example, an embodiment of the disclosure and parts of another embodiment of the disclosure may be combined to operate the device.

FIG. 1 is a block diagram of an electronic device 100 according to an embodiment of the disclosure.

Referring to FIG. 1, the electronic device 100 may obtain virtual object data of a target device from three-dimensional image data of the target device.

According to an embodiment of the disclosure, the target device may be a device from which the electronic device 100 is to acquire virtual object data. The target device according to the embodiment of the disclosure may include an electronic device including home appliances. For example, the target device may include a washing machine, a refrigerator, an air-conditioner, a speaker, a smart device, etc. However, the target device of the embodiment of the disclosure is not limited to the electronic device, but may include various objects. For example, the electronic device 100 may obtain virtual object data of a target object from three-dimensional image data of the target object. According to an example embodiment, the target object may include various objects such as a wardrobe, a desk, a chair, a car, a house, etc.

Hereinafter, the target device may refer to a target device located in a virtual space in which the virtual object data is represented.

The three-dimensional image data may be a large amount of data including geometric data representing an appearance and structure of the target device. Also, the three-dimensional image data may include attribute data of the target device. The attribute data may include a size, a weight, a center of gravity, a material, and joint information between members, etc. with respect to the target device or a portion corresponding thereto.

The virtual object data may be simplified data including geometric data representing the appearance of the target device. The electronic device 100 according to the embodiment of the disclosure may acquire virtual object data for visually implementing the target device in the virtual world of augmented reality, based on the three-dimensional image data of the target device. That is, the virtual object data of the target device may be used to provide information about the target device to augmented reality service.

The electronic device 100 may acquire three-dimensional image data of the target device from a server 10. Alternatively, the electronic device 100 may acquire three-dimensional image data stored in a memory of the electronic device 100. Alternatively, the electronic device 100 may be connected to a network 200 including a cloud, to acquire three-dimensional image data from the network 200.

The electronic device 100 may acquire data about at least one of a type of the target device, a direction of the target device, or components in the target device from the three-dimensional image data of the target device, in order to acquire the virtual object data. Based on the acquired data, the electronic device 100 may convert the three-dimensional image data of the target device into the virtual object data. According to an embodiment, the direction of the target device is the main direction of the target device. The main direction of the target device may be a main view of the target device.

The electronic device 100 may identify components included in the target device in order to, for example, convert the three-dimensional image data of the target device into the virtual object data.

The three-dimensional image data according to the embodiment of the disclosure may include data about a plurality of components included in the target device. In particular, the three-dimensional image data may include component image data representing the appearance of each component in the target device. For example, when the target device is a refrigerator, the three-dimensional image data may include component image data respectively representing appearances of a door, a knob, a water purifier, a motor, etc. included in the refrigerator.

The electronic device 100 may identify data of an exposed component or an exposed part exposed on an outer portion of the target device, based on the component image data included in the three-dimensional image data of the target device. The exposed component may be a component at least a part of which is photographed by a camera located at an arbitrary position outside the target device. That is, the exposed component may be a component at least partially reached by light from a light source at an arbitrary position outside the target device.

According to an embodiment, the exposed part may be an exposed part of the exposed component that is photographed by a camera located at an arbitrary position outside the target device. That is, the exposed part may be a part reached by the light from the light source at an arbitrary position outside the target device. Here, the electronic device 100 may identify the exposed component or the exposed part by using the three-dimensional image data and a virtual camera or a virtual light source located in the virtual space in which the three-dimensional image data is represented.

According to an embodiment, the exposed component or the exposed part exposed on an outer portion of the target device may include a case in which a first component is exposed to outside in an open state when there is a second component that is open/closed in the target device. For example, when the target device is a refrigerator, an internal wall of a fridge is exposed when a door of the refrigerator is open, and thus may be identified as an exposed component. However, a compressor built in the refrigerator is not photographed by the camera on the outside regardless of whether the door is open or closed, and thus may not be identified as an exposed component. In addition, exposing to the outside the target device may include exposing through a transparent component when there is the transparent component in the target device.

The electronic device 100 may acquire exposed component image data about identified exposed components from the three-dimensional image data. The exposed component image data may include geometric data representing appearances and structures of the exposed components. The exposed component image data according to the embodiment of the disclosure may be obtained by further removing data about other parts than the exposed part in the exposed components.

According to an embodiment, the electronic device 100 may identify a type of the target device in order to acquire the virtual object data from the three-dimensional image data of the target device. Here, the type of the target device may be information for identifying a category to which the target device belongs. The type of the device according to an embodiment of the disclosure may include a product group, a model name, etc. of the target device. For example, when the target device is a refrigerator, the type may include 'electronic device', 'home appliance', 'refrigerator', '2-door refrigerator', 'IRS82M6000', etc. The electronic device 100 may use geometric data, attribute data, metadata, file name, etc. of the target device included in the three-dimensional image data, in order to identify the type of the target device.

The electronic device 100 may determine at least one of the exposed components or the main direction of the target device implemented in the virtual reality, based on the identified type of the target device and the components included in the target device. The electronic device 100 may acquire the virtual object data from the three-dimensional image data of the target device, based on at least one of the determined exposed components or the main direction of the target device.

In the specification, the main direction may include at least one direction that is determined in advance from among the directions seeing the target device in the virtual space in which the virtual object data of the target device is expressed, based on at least one of a functional characteristic or a design characteristic of the target device. That is, the main direction may be a direction that is determined to be frequently exposed or focused when the user views the target device in the virtual space including the augmented reality. Identifying the main direction of the target device may be identifying a main view of the target device. Examples of the main direction of the target device will be described later with reference to FIG. 7.

The target device 100 may set a directional weight for each direction from which the target device is seen, based on the identified main direction. Each direction of looking at the target device according to the embodiment of the disclosure may be set based on a coordinate system set in the virtual space. For example, when a three-dimensional rectangular coordinate system is set in the virtual space, a plurality of directions looking at the electronic device may be defined based on XY, YZ, and XZ planes of the coordinate system.

According to an embodiment of the disclosure described below, it is assumed that six directions looking at a front surface, a rear surface, opposite side surfaces (a right side surface and a left side surface), an upper surface, and a lower surface of an electronic device are defined in the three-dimensional rectangular coordinate system. However, one of ordinary skill in the art would understand that the technical characteristics about the coordinate system and the directions are not limited to the above-described examples.

Also, the electronic device 100 may set a component weight for each exposed component based on at least one of the three-dimensional image data of the target device or the identified type of the target device. The component weight may be determined in advance according to priority order that each of the individual component has to be visualized in the virtual object data.

The electronic device 100 according to the embodiment of the disclosure may set the component weight based on functional characteristics of the component. For example, a component that has to be located within a certain distance from a connector such as a drain or an electrical outlet may have a high priority. Alternatively, a component that is an important clue in installation of a product or has to be spaced a preset distance apart from the wall or other products, e.g., a heat exhaust or a control panel, may have a high priority. Otherwise, a component that is impressively recognized by a customer in view of design, e.g., a door of a washing machine, may have a high priority.

In addition, the electronic device 100 according to the embodiment of the disclosure may set a component weight based on a shape complexity of component image data corresponding to the exposed component. For example, when available resources are allocated excessively to a component having a simple shape, the electronic device 100 may set the component weight to the component to have a low priority. Alternatively, when a component has a complicated shape, the electronic device 100 may set the component weight to the component to have a high priority. According to an embodiment of the disclosure, the shape complexity of the component image data may be calculated based on a variance of a surface normal direction per unit area. However, one of ordinary skill in the art would understand that the method of calculating or acquiring the shape complexity is not limited to the above example.

The electronic device 100 may recognize the component of high priority from the three-dimensional image data based on the identified type of the target device, or may recognize the component of high priority based on a user input. In order to set the component weight, the electronic device 100 may use geometric data, attribute data, metadata, file name, etc. of the electronic device included in the three-dimensional image data. In addition, the electronic device 100 may correct the component weight of each component based on a user input.

The electronic device 100 may determine an upper limit of a size of data for expressing the appearance of each exposed component, based on at least one of a direction in which the exposed component is exposed, the direction weight, or the component weight. As an example, the size of data may be a capacity occupied by the data.

The electronic device 100 may obtain virtual object data representing the appearance of the target device, by adjusting the size of data for representing the appearance of the exposed component in the component image data of each exposed component based on the determined size.

The electronic device 100 may determine a texture to be applied to the virtual object data of the target device, based on the identified type of the target device. The electronic device 100 may apply the texture to the obtained virtual object data. The electronic device 100 according to the embodiment of the disclosure may correct all or a part of the applied texture based on a user input.

The electronic device 100 may output generated virtual object data. The electronic device 100 according to the embodiment of the disclosure may output the virtual object data of the target device to the server 10. Alternatively, the electronic device 100 may store the virtual object data of the target device in a memory of the electronic device 100. Alternatively, the electronic device 100 may be connected to a network including a cloud, and may transfer the virtual object data of the target device to the network.

Figure 2:
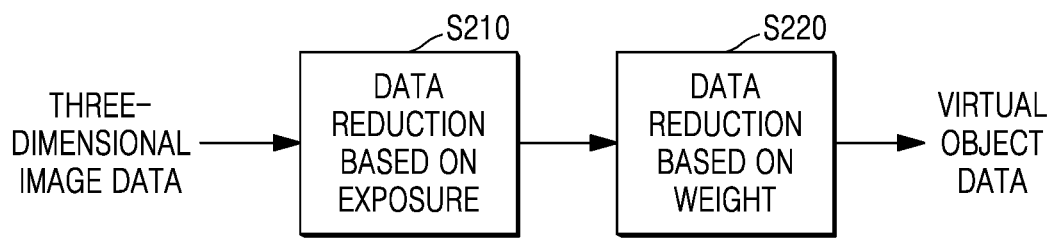
FIG. 2 is a diagram illustrating a method of acquiring virtual object data according to an embodiment of the disclosure.

FIG. 2 is a diagram illustrating a method of acquiring virtual object data by an electronic device according to an embodiment of the disclosure.

Referring to FIG. 2, the electronic device may obtain the virtual object data by reducing the three-dimensional image data.

In operation S210, the electronic device may reduce the three-dimensional image data based on whether components are exposed or not.

The electronic device may acquire the virtual object data that is lightweight and maintains visual quality, by removing internal elements that are not visually recognized by a user who observes the target device from the three-dimensional image data. According to an embodiment, the virtual object data that is lightweight may correspond to a relatively smaller amount of data than the original the three-dimensional image data.

For example, the electronic device may store, from the component image data included in the three-dimensional image data, the component image data corresponding to the exposed component, and may remove the component image data corresponding to other components than the exposed component. Alternatively, the electronic device may only store the component image data corresponding to a component that is identified as the exposed component in a state where a component that may be open/closed is closed. Alternatively, the electronic device may only store the component image data corresponding to a component that is identified as the exposed component in a state where a component that may be open/closed is open. Alternatively, the electronic device may only store data corresponding to an exposed part and may remove data corresponding to an unexposed part, in the component image data corresponding to the exposed component. In the embodiment of the disclosure, the weight reduction of the three-dimensional image data based on the exposure may be performed in various ways, including a combination of the above-stated examples.

In operation S220, the electronic device may reduce the three-dimensional image data based on a weight and output virtual object data. The electronic device may obtain virtual object data that is lightweight and maintain visual quality from the three-dimensional image data, by allocating more available data resources to visually important portions based on the weights.

According to an embodiment of the disclosure, the weight that the electronic device may use to reduce the three-dimensional image data may include at least one of the direction weight or the component weight.

As described above, the direction weight may be set with respect to the plurality of directions looking at the electronic device in the virtual space in which the three-dimensional image data of the target device is represented. The component weight may be determined in advance according to priority order that each of the individual component has to be visualized in the virtual object data.

The electronic device may allocate more available data resources, for example, based on the direction weight and the component weight, to a component having a relatively high weighted sum of the two weights as compared with a component having a relatively low weighted sum of the two weights. That is, the component having higher weighted sum of the two weights may preserve more visual details, as compared with the component having lower weighted sum of the two weights.

The electronic device may determine an upper limit in a size of data for representing the appearance of each component included in the electronic device based on, for example, the direction weight and the component weight. The electronic device may reduce the three-dimensional image data based on the determined upper limit in the data size.

The electronic device may output the reduced data as the virtual object data.

Hereinafter, an example of determining exposed components of the target device by using a virtual light source will be described below with reference to FIGS. 3 and 4. The virtual light source is a preset light source implemented in the virtual space in which the three-dimensional image data of the target device is represented, and may be implemented by a preset software (S/W) module.

Because recognizing and/or emphasizing of an object in the virtual space by using the virtual light source implemented by the S/W module corresponds to a general technique in the field of three-dimensional image technology, detailed descriptions about the method of implementing the virtual light source will be omitted in the description below with reference to FIGS. 3 and 4.

Figure 3:
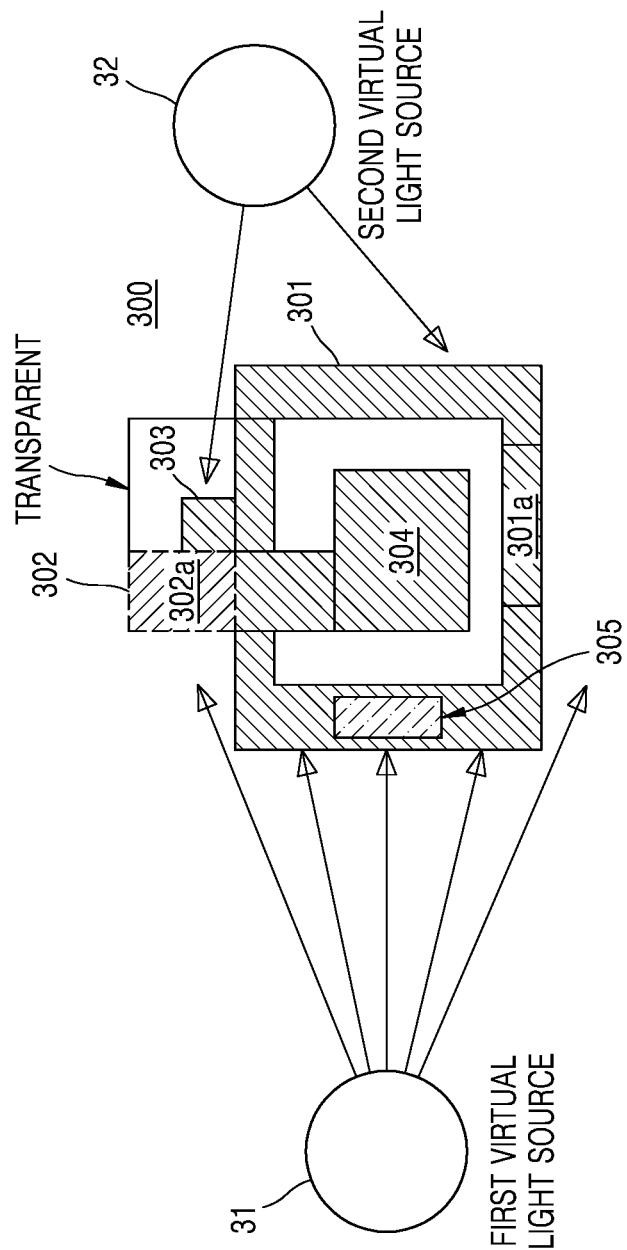
FIG. 3 is a diagram illustrating a method of determining an exposed component according to an embodiment of the disclosure.

FIG. 3 is a diagram illustrating a method of determining an exposed component according to an embodiment of the disclosure.

In detail, FIG. 3 shows a state in which a target device 300 is located with a first virtual light source 31 and a second virtual light source 32 in a virtual space in which three-dimensional image data of the target device is represented.

The target device 300 includes, for example, five components, that is, a first component 301, a second component 302, a third component 303, a fourth component 304, and a fifth component 305. In the embodiment of the disclosure, the first component 301 includes a door 301a.

According to the embodiment of the disclosure, because virtual light emitted from the first virtual light source 31 and the second virtual light source 32 reaches the first component 301, the first component 301 may be identified as an exposed component. Also, the virtual light emitted from the first virtual light source 31 and the second virtual light source 32 reaches a part 302a of the second component 302, and thus, the second component 302 may be identified as an exposed component. Also, the virtual light emitted from the second virtual light source 32 reaches the third component 303 after passing through a transparent portion, the third component 303 may be identified as an exposed component. On the other hand, virtual light emitted from an arbitrary external light source including the first and second virtual light sources 31 and 32 may not reach the fourth component 304 and the fifth component 305, and thus, the fourth component 304 and the fifth component 305 may not be identified as exposed components.

Figure 4:
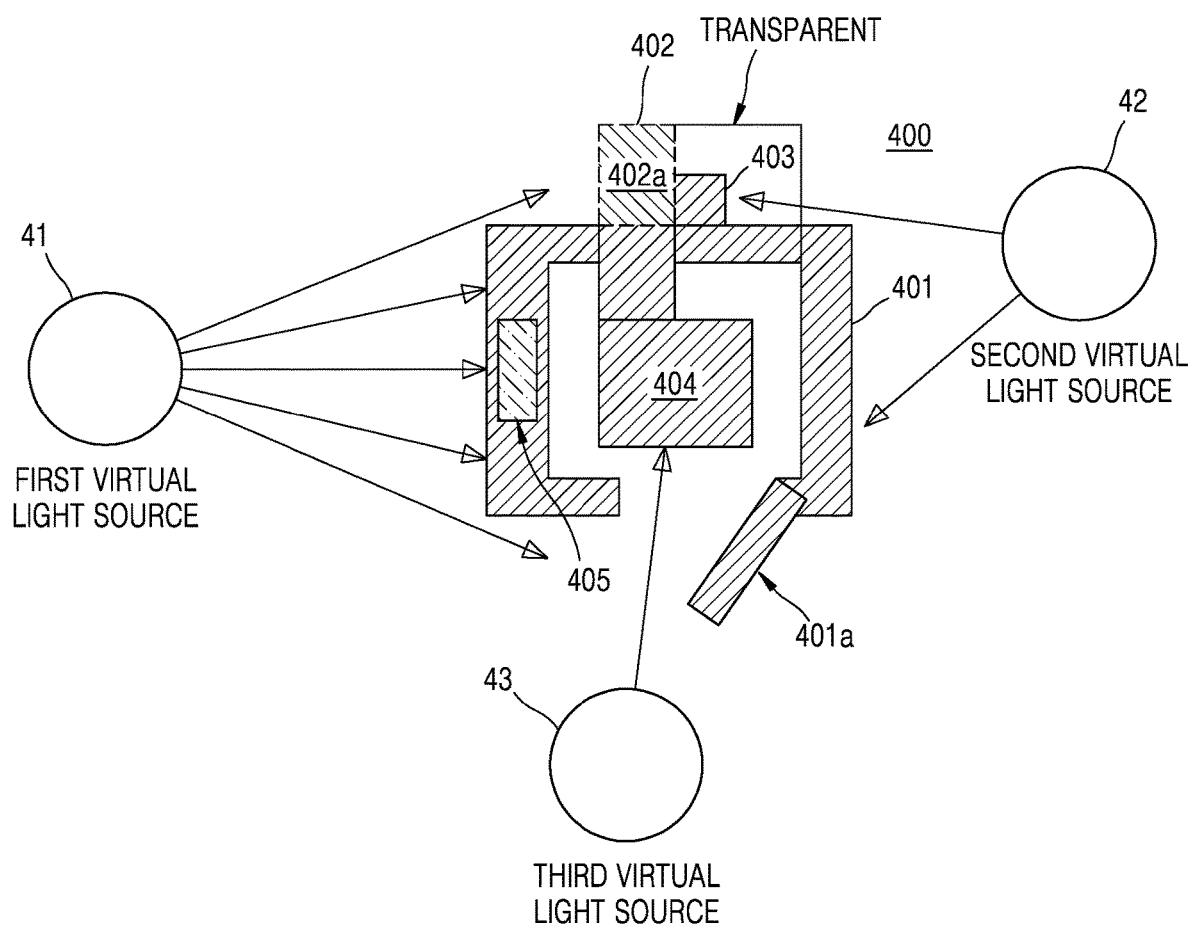
FIG. 4 is a diagram illustrating a method of determining an exposed component according to an embodiment of the disclosure.

FIG. 4 is a diagram illustrating a method of determining an exposed component according to an embodiment of the disclosure.

In detail, FIG. 4 shows a state in which a target device 400 is located with a first virtual light source 41, a second virtual light source 42, and a third virtual light source 43 in a virtual space in which three-dimensional image data of the target device 400 is represented.

The target device 400 includes, for example, five components, that is, a first component 401, a second component 402, a third component 403, a fourth component 404, and a fifth component 405. In the embodiment of the disclosure, the first component 401 includes a door 401a. In FIG. 4, the door 401a may be in an open state.

According to the embodiment of the disclosure, because virtual light emitted from the first virtual light source 41 and the second virtual light source 42 reaches the first component 401, the first component 401 may be identified as an exposed component. Also, the virtual light emitted from the first virtual light source 41 and the second virtual light source 42 reaches a part 402a of the second component 402, and thus, the second component 402 may be identified as an exposed component. Also, the virtual light emitted from the second virtual light source 42 reaches the third component 403 after passing through a transparent portion, and thus, the third component 403 may be identified as an exposed component. On the other hand, virtual light emitted from an arbitrary external light source including the first and second virtual light sources 41 and 42 may not reach the fifth component 405, and thus, the fifth component 305 may not be identified as an exposed component.

Unlike in FIG. 3, because the door 401a is open in FIG. 4, the virtual light emitted from the third virtual light source 43 may reach the fourth component 404. Therefore, in FIG. 4, the fourth component 404 may be further identified as an exposed component.

Figure 5:
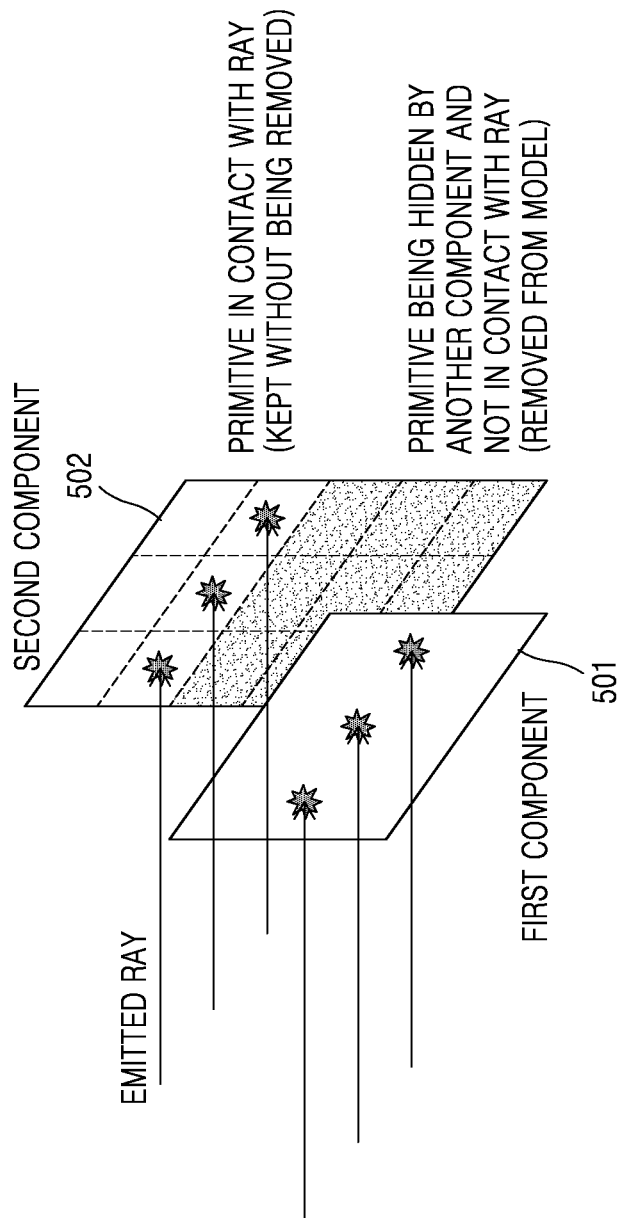
FIG. 5 is a diagram illustrating a method of determining an exposed component according to an embodiment of the disclosure.

FIG. 5 is a diagram illustrating a method of determining an exposed component according to an embodiment of the disclosure.

Referring to FIG. 5, a first component 501 and a second component 502 included in the target device are exemplarily shown. Dotted lines dividing a surface of the second component 502 of FIG. 5 express the shape of the surface of the second component as a polygon mesh.

In three-dimensional computer graphics, a shape of a polyhedron may be implemented as a polygon mesh that is obtained by connecting triangles, rectangles, or polygons to one another, and the polygon mesh may consist of primitives which are basic units. Examples of the primitive that is a basic unit of the polygon mesh may include a surface (e.g., a triangle or other polygons), a vertex (e.g., vertices of a triangle or other polygon surfaces), and an edge (a line segment connecting vertices).

Rays emitted from an arbitrary external light source may reach only a part of the second component 502 by means of the first component 501 located in front. The electronic device according to the embodiment of the disclosure may only identify the portion reached by the ray in the second component 502 as the exposed part. Here, a unit identified as the exposed part of the second component 502 may be a primitive unit of geometric data.

The electronic device according to the embodiment of the disclosure may obtain the virtual object data that is light-weight and maintains visual quality by removing data related to a primitive corresponding to unexposed part of the components included in the target device.

Figure 6:
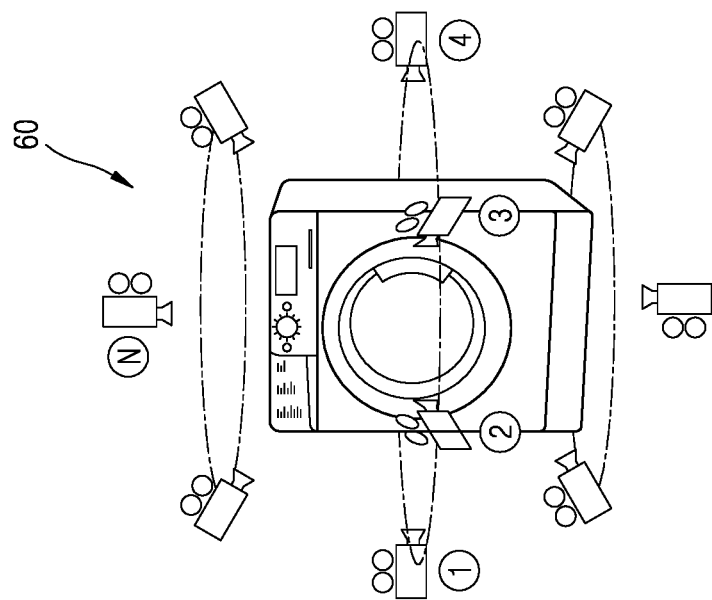
FIG. 6 is a diagram illustrating a method of determining an exposed component according to an embodiment of the disclosure.

FIG. 6 is a diagram illustrating a method of determining an exposed component according to an embodiment of the disclosure.

Referring to FIG. 6, it is illustrated that three-dimensional image data of a washing machine that is a target device and N virtual light sources are located in a virtual space (60).

In FIG. 6, the washing machine, that is, the target device, includes six components, e.g., a door, a front panel, a right panel, a left panel, an top panel, and a motor, as an example. Here, the electronic device determines whether virtual light emitted from the N virtual light sources reaches each of the components, and may determine a component that is in contact with at least one ray of virtual light as an exposed component.

Table 61 of FIG. 6 summarizes whether the virtual light emitted from the N virtual light sources is in contact with each of the components in the washing machine, that is, the target device. Referring to Table 61, the door, the front panel, the right panel, the left panel, and the top panel of the washing machine, that is, the target device, is in contact with the virtual light emitted from at least one virtual light source, and may be determined as exposed components. However, the motor is not in contact with any virtual light emitted from the virtual light source, and may not be determined as an exposed component.

According to the embodiment of the disclosure, the number N of the virtual light sources that are virtually located in order to determine the exposed component may be determined based on at least one of the size of the target device, the surface complexity, a required precision of the virtual object data, or design complexity of the target device. In addition, the electronic device may set or change the number N of the virtual light sources based on a user input.

Also, According to the embodiment of the disclosure, the plurality of virtual light sources may emit light while rotating about the target device by a preset angle, e.g., 360 degrees. The rotation angle of the plurality of virtual light sources, an interval between the virtual light sources, a distance between the plurality of virtual light sources and the target device, etc. may be determined to have optimized values based on at least one of the size of the target device, the surface complexity, the required precision of the virtual object data, or the design complexity of the target device. In addition, the electronic device may set or change the above-stated numerical values based on a user input.

According to an embodiment of the disclosure, when the target device includes a component that may be open/closed or movable, the electronic device may repeatedly perform the above operation of determining the exposed component while moving the component within a movable range. The number of times that the electronic device performs the operation of determining the exposed component may be determined as an optimized value based on at least one of the size of the target device, the surface complexity, the required precision of the virtual object data, or the design complexity of the target device.

For example, when the target device includes a door, the electronic device may perform the above operation of determining the exposed component both in a state in which the door of the target device is open and a state in which the door of the target device is closed, or while opening the door or while closing the door. Alternatively, when the target device includes a lift having a scaffold which is moved up, middle, or down, the electronic device may perform the above-stated operation of determining the exposed component in an each state in which the scaffold of the lift of the target device is at the upper position, the middle position, or the lower position, or while moving the lift.

According to the embodiment of the disclosure, when the target device includes a transparent component, the electronic device may perform the above-stated operation of determining the exposed component in a state in which the transparent component is removed. The electronic device may perform the operation of determining the exposed component in a state in which the transparent component is temporarily removed, thereby allowing the virtual light to reach inside the transparent component more efficiently. According to the embodiment of the disclosure, when the target device includes a semi-transparent component, the electronic device may perform the above-stated operation of determining the exposed component in a state in which the semi-transparent component is removed, when a transparency of the component is equal to or greater than a preset numerical value. In addition, the electronic device may set or change whether to remove the component having transparency based on a user input.

In FIG. 6, the method of determining the exposed component according to an embodiment of the disclosure, but one of ordinary skill in the art would appreciate that the embodiment of the disclosure may be similarly applied to determining of exposed parts.

Figure 7:
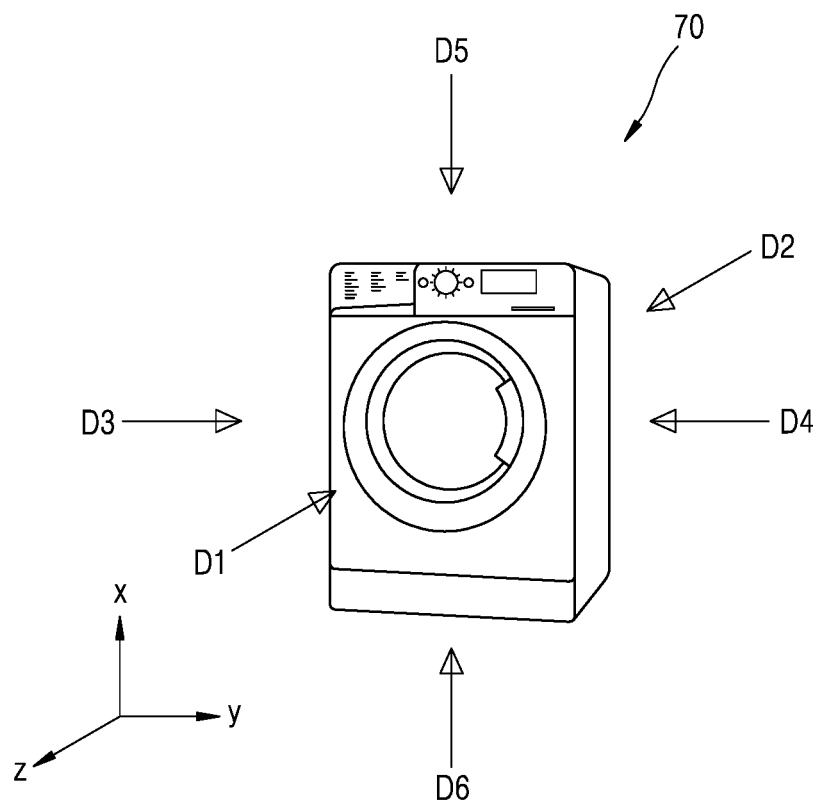
FIG. 7 is a diagram illustrating a method of setting a direction weight according to an embodiment of the disclosure.

FIG. 7 is a diagram illustrating a method of setting a direction weight according to an embodiment of the disclosure.

Referring to FIG. 7, a case in which a three-dimensional rectangular coordinate system is set in a virtual space is shown (70).

According to the embodiment of the disclosure, a front surface direction D1 and a rear surface direction D2 are defined in a normal direction of an XY plane in the rectangular coordinate system in the virtual space. Also, a left side direction D3 and a right side direction D4 are defined in the normal direction of an XZ plane of the rectangular coordinate system, and an upper surface direction D5 and a lower surface direction D6 are defined in the normal direction of a YZ plane of the rectangular coordinate system. However, the above definition of the directions is an example, and one of ordinary skill in the art would appreciate that the coordinate system and the plurality of directions may be defined in various ways.

When the user looks at the target device in a virtual space including augmented reality, there may be a direction that is frequently exposed or valued, that is, a main direction, based on the type of the target device. For example, when the target device is a refrigerator, design of a front portion of the refrigerator may be important for the user to classify the product. On the other hand, design of a rear portion and side portions that are adjacent to a wall surface or peripheral objects may not be as important as the front portion design. However, when the target device is a washing machine, design of side portions, as well as a front portion of the washing machine, may be important in classification of the product, and thus, a lot of available resources may be allocated to components located at the side portions. That is, a direction that is valued when the user looks at the target device may vary depending on the type of the target device, and the electronic device according to the disclosure may deal with the above issue by using a direction weight that is determined based on a main direction of the target device.

According to an embodiment of the disclosure, the type of the target device may include information for identifying a category to which the target device belongs. The type according to the embodiment of the disclosure may include a product group, a model name, etc. of the target device. The electronic device may use geometric data, attribute data, metadata, file name, etc. of the target device included in the three-dimensional image data, in order to identify the type of the target device.

In addition, the electronic device may obtain a database including information about a preset type and a direction weight corresponding to the type. The electronic device may obtain the database from a server. Alternatively, the electronic device may obtain the data stored in a memory of the electronic device. Alternatively, the electronic device may be connected to a network including a cloud and may obtain the data from the network.

The electronic device may acquire a direction weight corresponding to the identified target device, from the database. The direction weight may be set with respect to each of a plurality of directions set based on the coordinate system.

Figure 8:
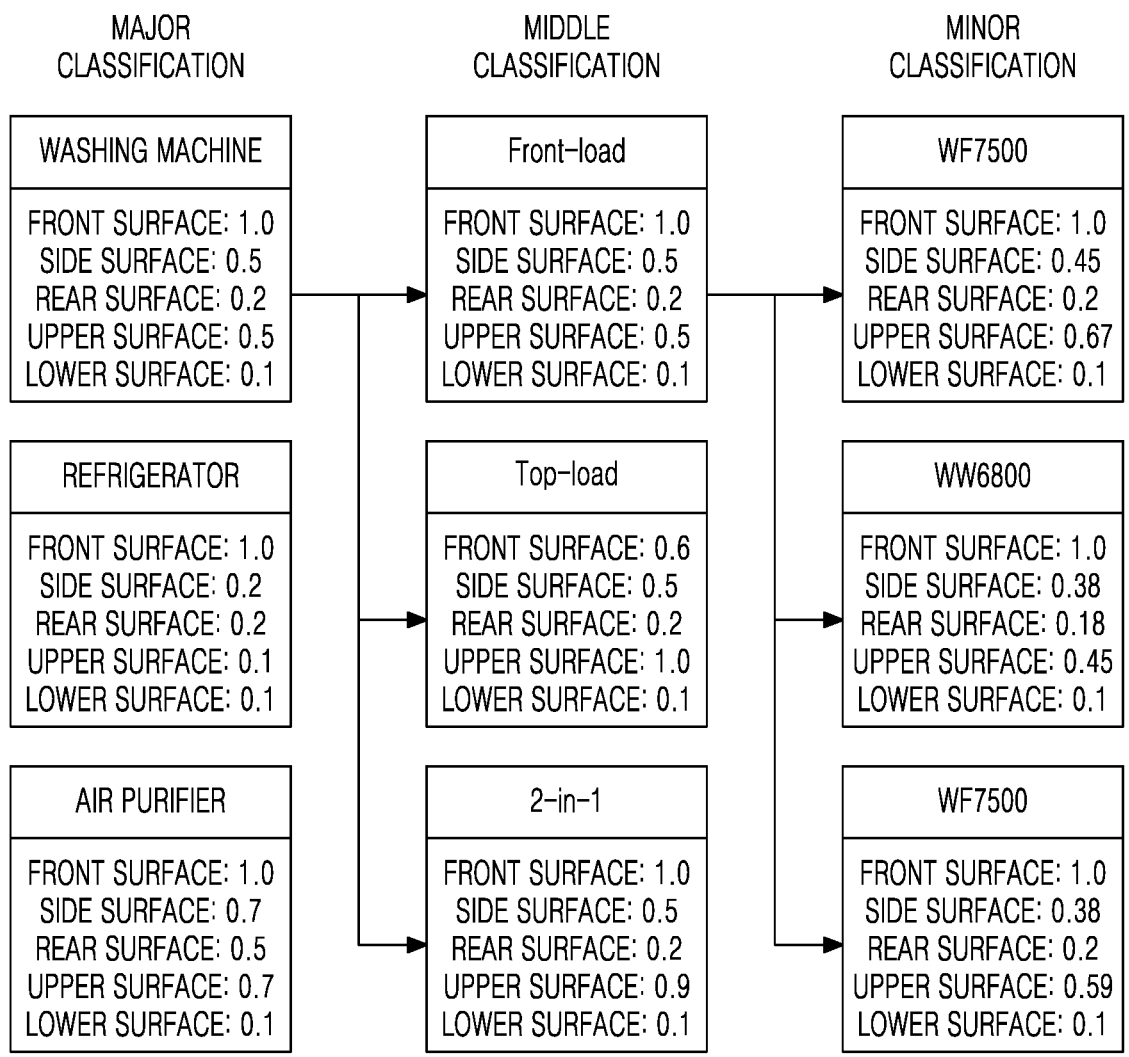
FIG. 8 is a diagram of a database including information about a direction weight according to an embodiment of the disclosure.

FIG. 8 is a diagram of a database including information about a direction weight according to an embodiment of the disclosure.

Referring to FIG. 8, the database may be configured hierarchically.

The database according to the embodiment of the disclosure may include a data field corresponding to the type and a data value corresponding to the direction weight. Name of the data field may correspond to the type of a target device, and the data value may correspond to a value of the direction weight corresponding to the type. Alternatively, the database may include a class corresponding to the type and an instance corresponding to the direction weight. Name of the class may correspond to the type of a target device, and the instance may correspond to the direction weight corresponding to the type.

The database may include a plurality of orders based on the data field or the class. A type field of each order may include a plurality of elements. In FIG. 8, a database having a major classification, a middle classification, and a minor classification is shown as an example. In addition, FIG. 8 shows that 'washing machine', that is, an element of the major classification tier includes 'Front-load', 'Top-load', and '2-in-1' as elements of the middle classification tier. Also, 'Front-load', that is, the element of the middle classification tier, includes model names 'WF7500', 'WW6800', and 'WF5300' as elements of the minor classification tier, as an example. However, the above example is only provided to describe the configuration method of the database, and one of ordinary skill in the art would appreciate that the hierarchical structure and elements in the database are not limited to the above example.

The electronic device may match the identified type of the target device with the type of the target device preset in the database. The electronic device may set the type of the target device having the highest coincidence from among the types of the target device set in the database, as the identified type of the target device.

As the identified type of the target device matches an element of a lower tier, more accurate direction weight may be obtained. For example, as illustrated in FIG. 8, when the identified type of the target device matches one of the elements included in the model names, that is, the minor classification tier, for example, 'WW6800', the electronic device may determine the identified type of the target device as the 'WW6800' model. However, it may be inefficient to keep the direction weight corresponding to segmented product information continuously up-to-date. Therefore, even when the identified type of the target device does not match the element of the minor classification tier, the electronic device may search for an element having the matching type with the identified target device or having a preset similarity or greater and set the found element as the identified type of the target device, by using the hierarchical structure of the database. For example, when the identified type of the target device is 'washing machine-Front load-WW6900', the electronic device may set the identified type of the target device as 'washing machine-Front load', that is, the element of the middle classification tier.

In FIG. 8, the direction weight with respect to each direction is illustrated as a rational number value having a maximum of 1.0, as an example. However, the embodiment of the disclosure is not limited thereto, that is, the direction weight according to the embodiment of the disclosure may be expressed and stored in various ways.

Figure 9:
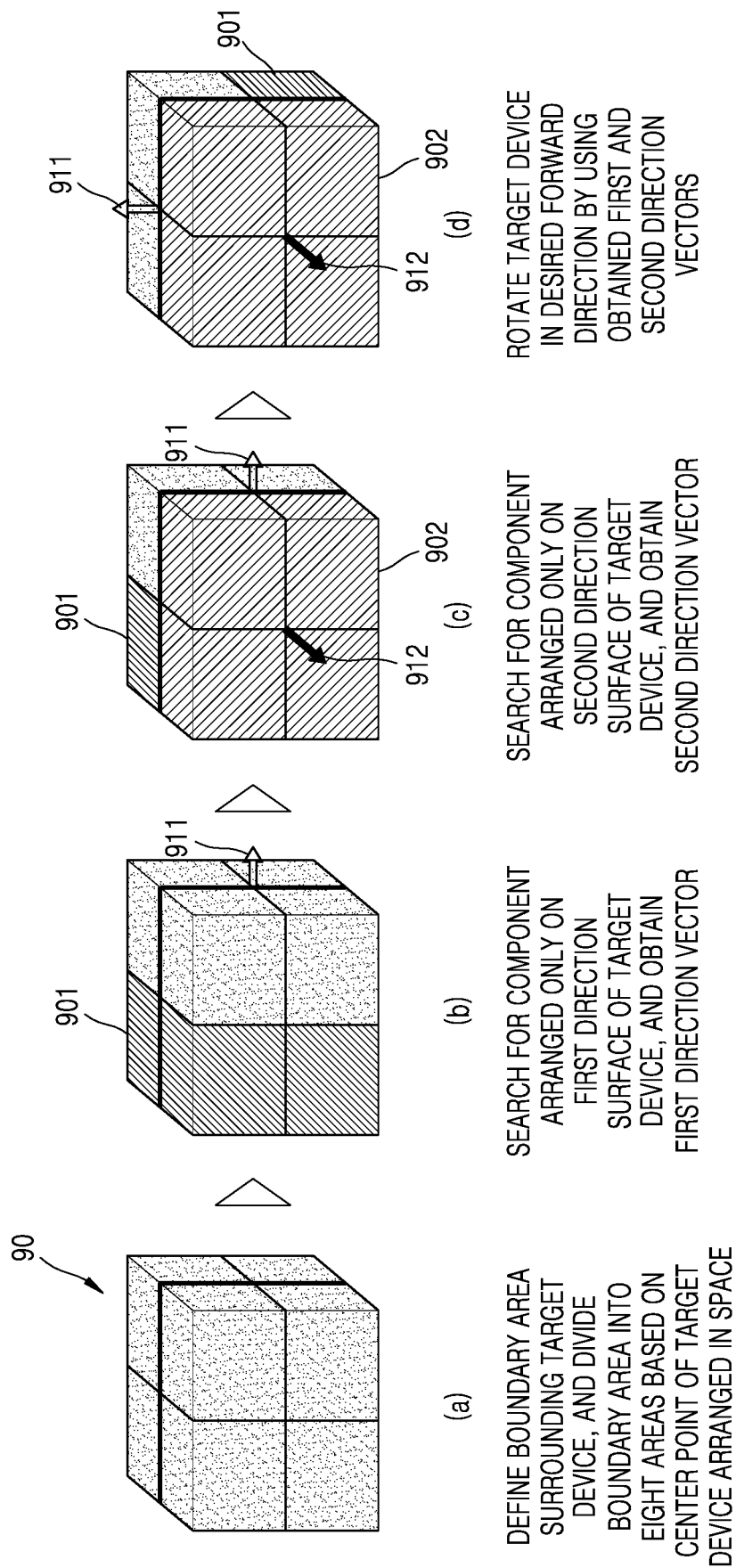
FIG. 9 is a diagram illustrating a method of aligning direction of a target device according to an embodiment of the disclosure.

FIG. 9 is a diagram illustrating a method of aligning direction of a target device according to an embodiment of the disclosure.

During a process of applying the direction weight that is set corresponding to the plurality of defined directions, it may be necessary to align the target device in an appropriate direction in the virtual space. Referring to FIG. 9, the electronic device may rotate or align the target device to be suitable for the plurality of directions defined in the virtual space.

In FIG. 9, operation (a), the electronic device according to the embodiment of the disclosure may define a boundary area surrounding the target device. The electronic device may divide the boundary area into n equal pieces based on a center point of the target device that is arranged in the virtual space, where in is an integer.

Referring to FIG. 9, a boundary area 90 is defined in the form of a rectangular parallelepiped and illustrated to be divided into eight equal pieces. However, one of ordinary skill in the art would appreciate that a shape of the defined boundary area and the number n of divisions may vary depending on the plurality of directions defined for applying a coordinate system and the direction weight in the virtual space. Also, the boundary area may not be divided into equal pieces according to another exemplary embodiment.

In FIG. 9, operation (b), the electronic device according to the embodiment of the disclosure searches for components that are mounted on a certain surface of the target device to determine which boundary area the found components are located in, from among the n boundary areas. According to a determination result, the electronic device may deduct a first direction vector that is a vector determining up-and-down directions of the target device.

The electronic device, for example, may search for the components that are only mounted on a first direction surface of the target device, and obtain the first direction vector based on the found first direction surface.

The electronic device may search for, for example, the components that are only mounted on a lower surface of the target device. The electronic device may search for the components that are only mounted on the lower surface of the target device based on, for example, that the component name includes 'wheel'.

For example, the electronic device may represent the boundary area including the component that is only mounted on the lower surface of the target device as the lower surface, that is, a first direction surface 901, and may obtain a lower surface vector that is perpendicular to the lower surface of the target device, as a first direction vector 911. According to a determination result, the electronic device may deduct a second direction vector that is a vector determining front-and-rear directions of the target device.

In FIG. 9, operation (c), the electronic device, for example, may search for the components that are only mounted on a second direction surface of the target device, and obtain the second direction vector based on the found second direction surface.

The electronic device may search for, for example, the components that are only mounted on a front surface of the target device. The electronic device may search for the components that are only mounted on the front surface of the target device based on, for example, that the component name includes 'front'.

For example, the electronic device may represent the boundary area including the component that is only mounted on the front surface of the target device as the front surface, that is, a second direction surface 902, and may obtain a front surface vector that is perpendicular to the front surface of the target device, as a second direction vector 912.

In FIG. 9, operation (d), the electronic device may rotate the target device in a desired direction by using the three-dimensional coordinate system set in advance, and the obtained first and second direction vectors 911 and 912. For example, the electronic device may rotate (i.e., align) the target device in a forward direction, so that a direction indicated by the first direction vector 911 matches the first direction set in advance and a direction indicated by the second direction vector 912 matches the second direction set in advance on the three-dimensional coordinate system.

Figure 10:
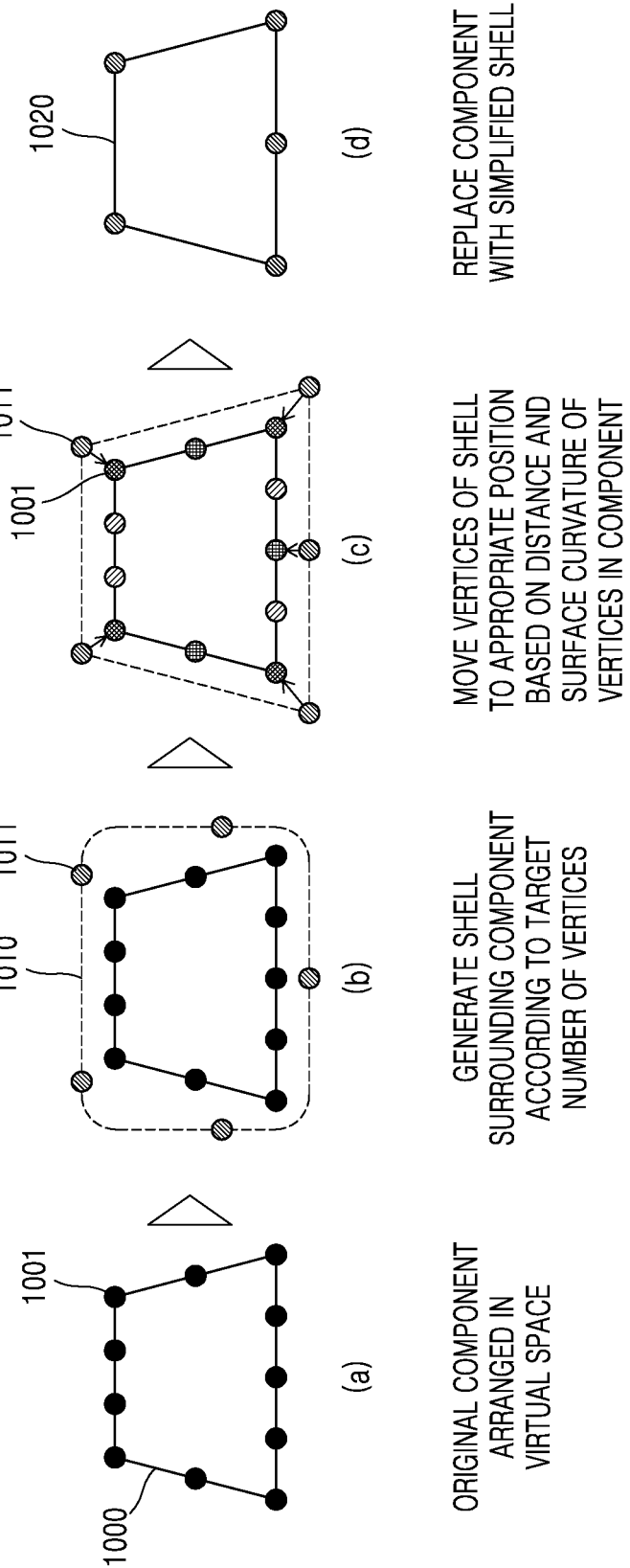
FIG. 10 is a diagram illustrating a method of reducing weight of image data of an exposed component, according to an embodiment of the disclosure.

FIG. 10 is a diagram illustrating a method of reducing weight of image data of exposed components, according to an embodiment of the disclosure.

When a lightweight operation is performed by merging primitives of a polygon mesh constituting original component image data, edges of the original component image may be lost or a surface distortion may occur frequently. The electronic device according to the embodiment of the disclosure may address the above issue caused by the merging of primitives, by obtaining new component image data using a mesh shell.

The electronic device according to the embodiment of the disclosure may determine an upper limit in the size of data for representing the appearance of each exposed component based on the weight, as described above.

Referring to FIG. 10, the determined upper limit in the size of the data is an upper limit in the number of vertices for representing the appearance of the exposed component, as an example. Hereinafter, this will be described below with reference to accompanying drawings.

Referring to FIG. 10, operation (a), a shape of an original component 1000 located in a virtual space is schematically shown based on the component image data. The original component 1000 located in the virtual space may include a plurality of vertices 1001 and meshes defined by the plurality of vertices 1001.

In FIG. 10, operation (b), the electronic device may generate a mesh shell 1010 surrounding the original component 1000 according to the target number of vertices determined based on the weight. In the embodiment of the disclosure, the mesh shell 1010 may include a plurality of vertices 1011 and meshes defined by the vertices 1011. The number of vertices in the generated mesh shell 1010 may be equal to or less than the target number of vertices. In FIG. 10, the number of vertices in the mesh shell 1010 is five as an example.

The target number of vertices is determined in order to reduce the component image data, and corresponds to the upper limit in the size of data for representing the appearance of the original component 1000. Therefore, the target number of vertices may be less than the number of vertices in the original component that is located in the virtual space. That is, the vertices of the original component 1000 and the vertices of the mesh shell 1010 may not be in one-to-one correspondence. Therefore, the electronic device may select some vertices corresponding to the vertices of the mesh shell, from among the vertices of the original component.

In the embodiment of the disclosure, the electronic device may select some vertices corresponding to the vertices of the mesh shell from among the vertices of the original component, based on distances between the vertices of the mesh shell and the vertices of the original component and a surface curvature of the original component. The electronic device may move the vertices of the mesh shell to locations of the selected vertices of the original component.

As shown in FIG. 10, the electronic device may select, from among vertices 1001 of the original component 1000, some vertices having relatively high surface curvature of the original component, that is, vertices where angles between edges connected to the vertices are relatively small, to correspond to five vertices 1011 of the mesh shell 1010.

In FIG. 10, operation (c), the shape of the mesh shell 1010 may be changed to a simplified shape of the original component 1000 when the vertices 1011 of the mesh shell 1010 move to the selected vertices of the original component 1000. Because the vertices having relatively high surface curvature are selected from among the vertices 1001 of the original component 1000, loss of main edges constituting the original component image or surface distortion during a simplification process in which the primitives are merged may be prevented.

In FIG. 10, operation (d), the electronic device may replace the component image data of the original component 1000 with a changed mesh shell 1020 to reduce the component image data representing the appearance of the original component 1000.

However, the embodiment of the disclosure illustrated with reference to FIG. 10 is an example of the method of reducing the component image data, and the method of reducing the component image data is not limited to the above example.

Figure 11:
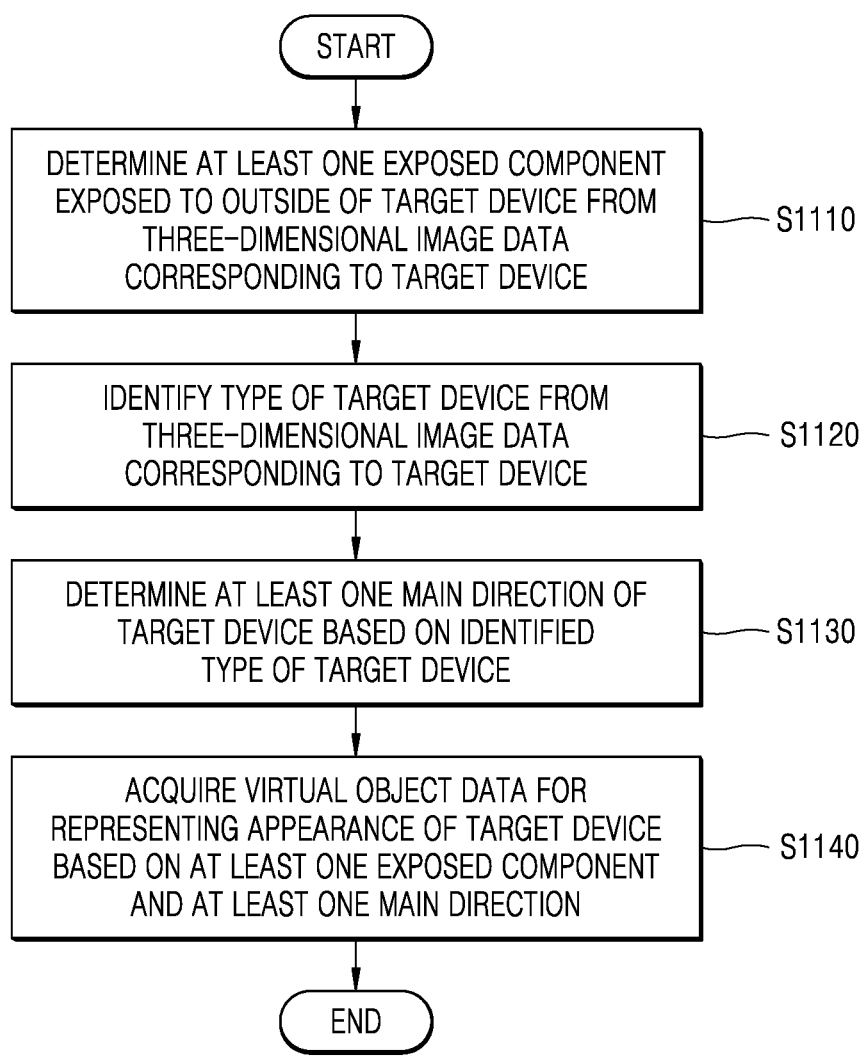
FIG. 11 is a flowchart illustrating a method of acquiring virtual object data according to an embodiment of the disclosure.

FIG. 11 is a flowchart illustrating a method of acquiring virtual object data according to an embodiment of the disclosure.

Referring to FIG. 11, in operation S1110, at least one exposed component of the target device may be determined from the three-dimensional image data corresponding to the target device.

For example, the three-dimensional image data may include component image data representing appearances of the components in the target device.

The exposed component of the target device may be a component at least a part of which is photographed by a camera located at an arbitrary position outside the target device. That is, the exposed component may be a component at least partially reached by light from a light source at an arbitrary position outside the target device. In addition, the exposed part may denote an exposed part of the exposed component that is photographed by a camera located at an arbitrary position outside the target device. That is, the exposed part may be a part reached by the light from the light source at an arbitrary position outside the target device. A part of the exposed component according to the embodiment of the disclosure may be identified in units of primitive of geometric data.

In addition, the exposed component of the target device may include a case in which the component is exposed to the outside in an open state when there is another component that is open/closed in the target device. For example, when the target device is a refrigerator, an internal wall of a fridge is exposed when a door of the refrigerator is open, and thus may be exposed as an exposed component. However, a compressor built in the refrigerator is not photographed by the camera on the outside regardless of whether the door is open or closed, and thus may be identified as not being an exposed component. In addition, exposing to the outside the target device may include exposing through a transparent component when there is the transparent component in the target device.

In operation S1120, a type of the target device may be identified from the three-dimensional image data corresponding to the target device.

The type of the target device may be information for identifying a category to which the target device belongs. The type of the target device according to the embodiment of the disclosure may include a product group, a model name, etc. of the target device. The electronic device may use geometric data, attribute data, metadata, file name, etc. of the target device included in the three-dimensional image data, in order to identify the type of the target device.

In operation S1130, at least one main direction of the target device may be determined based on the identified type of the target device.

The at least one main direction of the target device according to the embodiment of the disclosure may be set based on a coordinate system set in a virtual space.

For example, in order to determine the at least one main direction of the target device, a database including information about a preset type of the target device and a main direction corresponding to the preset type of the target device may be obtained. The preset type of the target device included in the database may match with the identified type of the target device. Based on a matching result, the at least one main direction of the target device may be determined.

In operation S1140, virtual object data for representing the appearance of the target device may be generated based on the determined at least one exposed component and the at least one main direction.

A component weight may be set with respect to the determined at least one exposed component. The component weight may be determined in advance according to priority order that each of the individual component has to be visualized in the virtual object data. The electronic device according to the embodiment of the disclosure may set the component weight at least one of a functional characteristic of the component or a shape complexity of the component image data corresponding to the exposed component.

A size of data for representing the appearance of the target device may be determined based on the component weight. As an example, the size of data may denote a capacity occupied by the data. Alternatively, the size of data may denote the number of primitives in the geometric data included in the data.

In an example, exposed component image data about identified exposed components may be obtained from the three-dimensional image data. The exposed component image data may include geometric data representing appearances and structures of the exposed components. The exposed component image data according to the embodiment of the disclosure may be obtained by further removing data about a part rather than the exposed part in the exposed components.

In addition, a direction weight may be set with respect to the determined at least one main direction. A size of data for representing the appearance of the target device may be determined based on the direction weight. As an example, the size of data may denote a capacity occupied by the data. Alternatively, the size of data may denote the number of primitives in the geometric data included in the data.

In addition, a texture to be applied to the virtual object data of the target device may be determined based on the identified type of the target device. When the texture is determined, the determined texture may be applied to the virtual object data. Also, all or some of the applied texture may be corrected based on a user input.

According to another embodiment of the disclosure, a method of acquiring virtual object data in augmented reality comprises identifying a type of a target object from three-dimensional image data corresponding to the target object, identifying a main view of the target object based on the type of the target object, and acquiring virtual object data for representing an appearance of the target object based on a first weight associated with one or more components of the target object or a second weight associated with one or more directions of the target object, the first and second weights corresponding to the main view. The one or more component may be visible from a view from outside of the target object.

The method may further comprise acquiring an original shape of the one or more components, the original shape located in a virtual space including a plurality of vertices, generating a mesh shell surrounding the original shape according to a target number of vertices identified based on the first or the second weights, selecting, from among plurality of vertices of the original shape, one or more vertices to correspond to the target number of vertices, shaping of the mesh shell by moving the target vertices to the selected vertices, and replacing component image data of the original shape with the shaped mesh shell to represent the appearance of the target object.

As described above, according to the method of acquiring the virtual object data of the embodiment of the disclosure, the virtual object data for representing the appearance of the target device in augmented reality may be obtained by reducing the three-dimensional image data. That is, the virtual object data of the target device may be used to provide information about the target device to augmented reality service.

Figure 12:
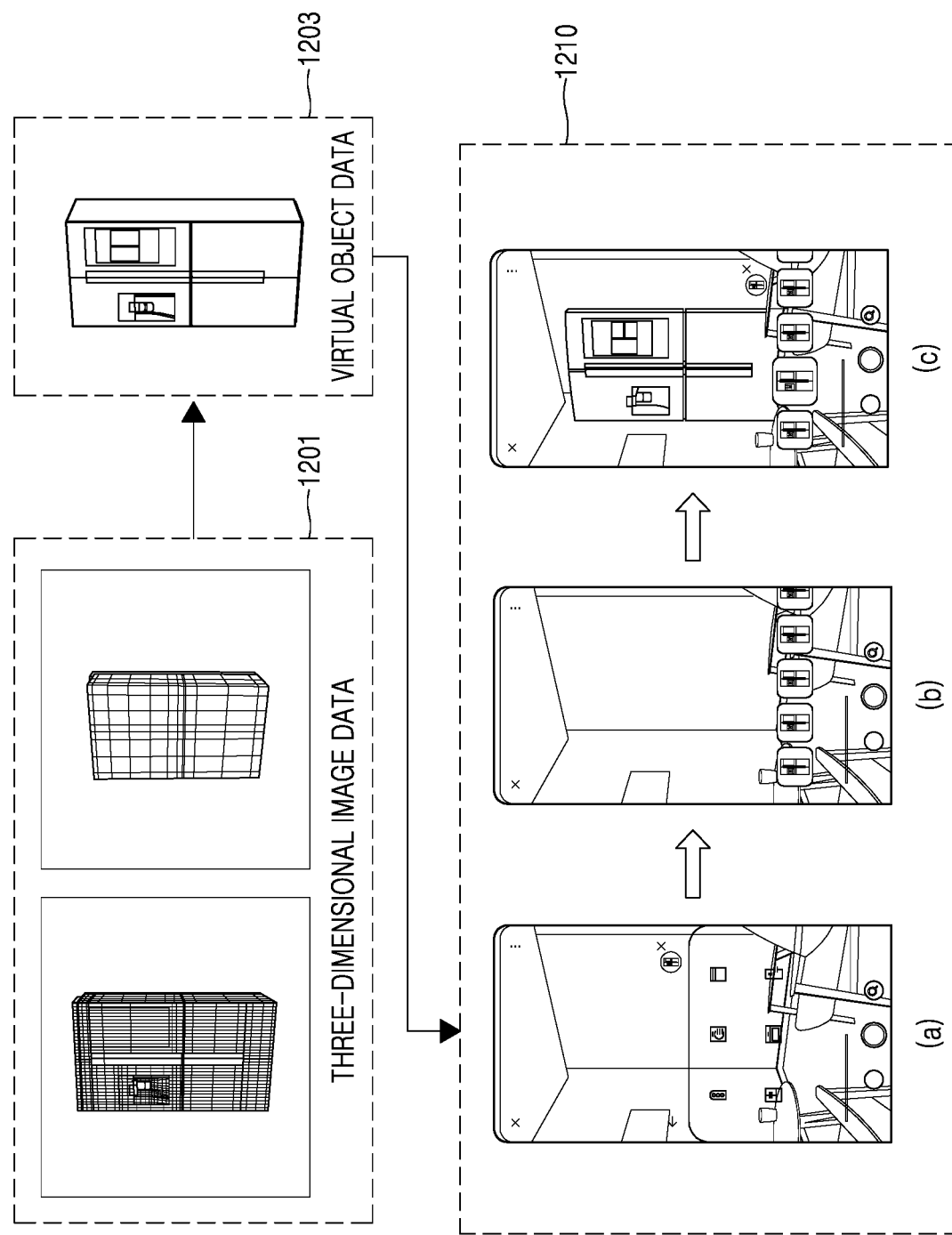
FIG. 12 is a diagram illustrating a method of implementing a target device based on virtual object data according to an embodiment of the disclosure.

FIG. 12 is a diagram illustrating a method of implementing a target device based on virtual object data 1203 according to an embodiment of the disclosure.

Referring to FIG. 12, the virtual object data 1203 may be obtained from three-dimensional image data 1201 according to the method of acquiring the virtual object data of the disclosure. The method of obtaining the virtual object data 1203 through the reduction in the three-dimensional image data 1201 is described above, and thus, detailed descriptions about the method are omitted.

For example, the three-dimensional image data 1201 may include computer-aided design (CAD) data. That is, the three-dimensional image data 1201 may be directly used in development and design of the target device, and may include CAD data that is a resultant of a process, in which a user drafts and designs the target device by using a two-dimensional (2D) and/or three-dimensional (3D) graphics tool. The three-dimensional image data 1201 may be of, for example, OBJ or STL data format, but is not limited thereto.

In addition, the virtual object data 1203 may include three-dimensional appearance data used in an application for implementing the target device in augmented reality. The virtual object data 1203 may be used, for example, for implementing the appearance of the target device in an application, and may be a resultant of converting the three-dimensional image data 1201 through a certain S/W module. The certain S/W module may include, for example, an instruction for executing the method of reducing the three-dimensional image data 1201 described above. The virtual object data 1203 may be of, for example, FBX or GLB data format, but is not limited thereto.

Referring back to FIG. 12, an example (1210) in which the virtual object data 1203 is used to visually implement the appearance of the target device in an application is shown.

The application according to the embodiment of the disclosure may provide the user with an augmented reality service that allows the user to arrange a target object in a space. According to an embodiment, the space may be a preset space. That is, when the user selects a target device to be arranged and a location and a direction of the target device while the preset space is being photographed through the application, the application may arrange the target device in a virtual space corresponding to the selection. The application displays the photographed space combined with the virtual space in which the target device is arranged (views (a)-(c) in FIG. 12), and thus, may provide the user with an experience as if the target device is actually installed in a preset indoor space.

As described above, according to the method of generating the virtual object data, the virtual object data of each target device may be acquired through a process of reducing the three-dimensional image data that is used in drafting and designing of the target device without directly generating the virtual object data corresponding to each target device, and thus, the time and costs required for providing the augmented reality service may be effectively reduced.

Figure 13:
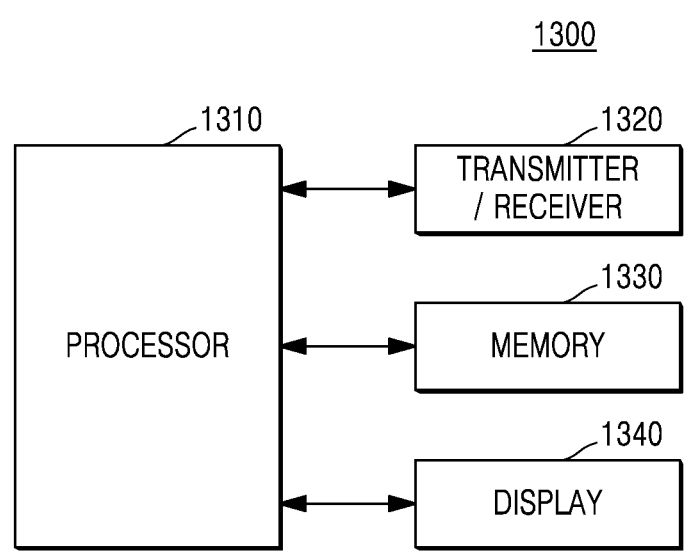
FIG. 13 is a block diagram of an electronic device according to an embodiment of the disclosure.

FIG. 13 is a block diagram of an electronic device 1300 according to an embodiment of the disclosure. Referring to FIG. 13, the electronic device 1300 may include a processor 1310, a transmitter/receiver 1320, a memory 1330, and a display 1340.

The processor 1310 controls overall operations of the electronic device 1300. The processor 1310 may be configured to process at least one instruction by executing basic arithmetic, logic, and input/output operations. The instruction may be provided to the processor 1310 from the memory 1330. That is, the processor 1310 may be configured to execute the instruction according to a program code stored in a recording device such as the memory 1330. Alternatively, the instruction may be provided to the processor 1310 via the transmitter/receiver 1320.

In an example, the processor 1310 may include a central processing unit (CPU). Although not shown in FIG. 13, the processor 1310 may operate in linkage with at least one another processor. Here, the at least one another processor may include a graphics processing unit (GPU). The processor 1310 and at least one another processor that operate in linkage with each other according to the embodiment of the disclosure may process at least one instruction cooperate with each other in such a way that an operation amount of the processor 1310 is reduced and a task corresponding to the reduced operation amount is assigned to the at least one another processor.

The processor 1310 may control the electronic device 1300 to acquire the virtual object data of the target device from the three-dimensional image data of the target device. Also, the processor 1310 may control the display 1340 to display the process of acquiring the virtual object data. In the embodiment of the disclosure, the display 1340 may support a touch input. The processor 1310 may control the display 1340 to set or correct the numerical values used in the process of acquiring the virtual object data based on a user input.

In addition, the processor 1310 may receive a request of the user for the virtual object data of the target device through a network or the display 1340. The processor 1310 may acquire the three-dimensional image data of the target device from a server, the network, or the memory, based on the received request for the virtual object data. For example, when receiving a request for the virtual object data of a washing machine model No. 'WF7500' from the user, the processor 1310 may acquire three-dimensional image data of the washing machine model No. 'WF7500' stored in advance, from the server, the network, or the memory. The processor may acquire the virtual object data of the target device by reducing the three-dimensional image data and may output the virtual object data.

The electronic device 1300 according to the embodiment of the disclosure may include, but is not limited to, a server, a computing device, a smartphone, a tablet personal computer (PC), a PC, a smart TV, a mobile phone, a personal digital assistant (PDA), a laptop computer, a media player, a micro-server, a global positioning system (GPS) device, an electronic book terminal, a navigation system, a kiosk, an MP3 player, a digital camera, a household appliance, and other mobile or non-mobile computing devices. Also, the electronic device 1300 may include a wearable device such as a watch, glasses, a hair-band, a ring, etc. having a communication function and a data processing function. However, the embodiment of the disclosure is not limited thereto, that is, the electronic device 1300 may include all kinds of devices for acquiring virtual object data.

Also, the electronic device 1300 may communicate with the server and another device (not shown) via a network in order to acquire or output the three-dimensional image data and database. In this case, the network may include a local area network (LAN), a wide area network (WAN), a value added network (VAN), a mobile radio communication network, a satellite communication network, and a combination thereof. The network is, in a broad sense, a data network via which components of each network actively communicate with each other, and may include wired Internet, wireless Internet, and a mobile wireless communication network. For example, a wireless communication may be Wi-Fi, Bluetooth, Bluetooth low energy, Zigbee, Wi-Fi direct (WFD), ultra-wideband (UWB), infrared data association (IrDA), near field communication (NFC), etc., but is not limited thereto.

One or more embodiments of the disclosure may be implemented as S/W programs including instructions stored in a computer-readable storage medium.

For example, the computer may be a device capable of fetching instructions stored in a storage medium and operating according to the embodiment of the disclosure according to the instructions, and may include a device according to one or more embodiments of the disclosure or an external server connected to the device.

The computer-readable storage medium may be provided in the form of a non-transitory storage medium. Here, the term "non-transitory" simply denotes that the storage medium is a tangible device, and does not include a signal and a current, but this term does not differentiate between where data is semi-permanently stored in the storage medium and where the data is temporarily stored in the storage medium. For example, the non-transitory storage medium may include temporarily stored media such as registers, caches, buffers, etc., as well as non-transitory readable storage media such as CD, DVD, hard disk, Blu-ray disc, universal serial bus (USB), internal memory, memory card, ROM, or RAM.

Also, the method according to one or more embodiments of the disclosure may be provided as a computer program product.

The computer program product may include a S/W program, a computer-readable storage medium on which the S/W program is stored, or a product traded between a seller and a buyer.

For example, the computer program product may include a product (e.g., a downloadable app) in the form of an S/W program that is electronically distributed through a device manufacturer or an electronic market (e.g., Google™ Play Store or App Store). For electronic distribution, at least a part of an S/W program may be stored in a storage medium or temporarily generated. In this case, the storage medium may be a server of a manufacturer or an electronic market, or a storage medium of a relay server.

According to the disclosure, the virtual object data in augmented reality may be effectively provided.

What is claimed is:
1. A method of acquiring virtual object data in augmented reality, the method comprising:
    identifying at least one component of a target device from three-dimensional image data corresponding to the target device, the at least one component being exposed to a view from outside of the target device;
    identifying a product type of the target device from the three-dimensional image data corresponding to the target device;
    identifying a plurality of directions of the target device based on the product type of the target device;
    obtaining a component weight and a direction weight corresponding to the at least one component based on the product type of the target device; and
    acquiring virtual object data for representing an appearance of the target device based on the at least one component, the plurality of directions, and the component weight, and the direction weight, wherein the component corresponds to a structural element in the target device, and the component weight corresponds to a weight set for the structural element in the target device.

2. The method of claim 1, wherein the three-dimensional image data comprises computer-aided design (CAD) data.

3. The method of claim 1, wherein the identifying the at least one component of the target device comprises:
arranging the target device and at least one virtual light source in a virtual space, based on the three-dimensional image data; and
identifying a component reached by light emitted from the at least one virtual light source, from among a plurality of components included in the target device, as the at least one component.

4. The method of claim 3, wherein the identifying the component reached by light emitted from the at least one virtual light source, from among the plurality of components included in the target device, as the at least one component comprises:
rotating the at least one virtual light source about a virtual line passing through the target device as a central axis; and
identifying a component reached by the light emitted from the at least one virtual light source while the at least one virtual light source is rotating, from among the plurality to components included in the target device, as the at least one component.

5. The method of claim 3, wherein the identifying of the component reached by light emitted from the at least one virtual light source, from among the plurality of components included in the target device, as the at least one component comprises:
moving a component that is movable from among the plurality of components included in the target device; and
identifying the component reached by the light emitted from the at least one virtual light source while the other component is moved, from among the plurality of components included in the target device, as the at least one component.

6. The method of claim 3,
wherein the acquiring of the virtual object data for representing the appearance of the target device comprises identifying a size of the virtual object data based on at least one of the at least one component or the set component weight.

7. The method of claim 1, wherein the identifying of the plurality of directions of the target device based on the product type of the target device comprises:
obtaining a database including information about a preset product type of the target device and a main direction corresponding to the preset product type of the target device;
matching the preset product type of the target device in the database with the identified product type of the target device; and
identifying the plurality of directions of the target device based on a result of the matching.

8. The method of claim 7,
wherein the acquiring of the virtual object data for representing the appearance of the target device comprises determining a size of the virtual object data based on a direction weight.

9. The method of claim 8, wherein the direction weight is set corresponding to the plurality of defined directions from which the target device is to be visualized in the virtual object data.

10. The method of claim 1, wherein the plurality of directions of the target device is defined based on a three-dimensional coordinate system set in a virtual space.

11. The method of claim 1, wherein the three-dimensional image data is acquired from a network including a cloud.

12. The method of claim 1, wherein the component weight is set according to each individual component of the target device to be visualized in the virtual object data.

13. The method of claim 1, wherein the component weight is set according to a priority order in which each individual component of the target device is to be visualized in the virtual object data.

14. An electronic device for acquiring virtual object data in augmented reality, the electronic device comprising:
a memory storing one or more instructions; and
a processor configured to execute the one or more instructions to:
identify at least one component of a target device from three-dimensional image data corresponding to the target device, the at least one component being exposed to a view from outside of the target device,
identify a product type of the target device from the three-dimensional image data corresponding to the target device,
identify a plurality of directions of the target device based on the identified product type of the target device,
obtain a component weight and a direction weight corresponding to the at least one component based on the product type of the target device, and
acquire virtual object data for representing an appearance of the target device based on the at least one component, the plurality of directions, and the component weight and the direction weight,
wherein the component corresponds to a structural element in the target device, and the component weight corresponds to a weight set for the structural element in the target device.

15. The electronic device of claim 14, wherein the three-dimensional image data comprises computer-aided design (CAD) data.

16. The electronic device of claim 14, wherein the processor is further configured to execute the one or more instructions to:
arrange the target device and at least one virtual light source in a virtual space based on the three-dimensional image data, and
identify a component reached by light emitted from the at least one virtual light source, from among a plurality of components included in the target device, as the at least one component.

17. The electronic device of claim 16, wherein the processor is further configured to execute the one or more instructions to:
rotate the at least one virtual light source about a virtual line passing through the target device as a central axis, and
identify the component reached by the light emitted from the at least one virtual light source while the at least one virtual light source is rotating, from among the plurality of components included in the target device, as the at least one component.

18. The electronic device of claim 16, wherein the processor is further configured to execute the one or more instructions to:
  move another component that is movable from among the plurality of components included in the target device, and
  identify the component reached by the light emitted from the at least one virtual light source reaches while other component is moved, as the at least one component, from among the plurality of components included in the target device.

19. The electronic device of claim 16, wherein the processor is further configured to execute the one or more instructions to identify a size of the virtual object data based on the at least one component and the set component weight.

20. The electronic device of claim 14, wherein the processor is further configured to execute the one or more instructions to:
  obtain a database including information about a preset product type of the target device and a main direction corresponding to the preset product type of the target device,
  match the preset product type of the target device included in the database with the identified product type of the target device, and
  identify the plurality of directions of the target device based on a result of the matching.

21. The electronic device of claim 20, wherein the processor is further configured to execute the one or more instructions to determine a size of the virtual object data based on a direction weight.

22. The electronic device of claim 14, wherein the plurality of directions of the target device is defined based on a three-dimensional coordinate system set in a virtual space.

23. A non-transitory computer-readable recording medium having recorded thereon a program for executing, on a computer, a method of acquiring virtual object data in augmented reality, wherein the method comprises:
  identifying at least one component of a target device from three-dimensional image data corresponding to the target device, the at least one component being exposed to a view from outside of the target device;
  identifying a product type of the target device from the three-dimensional image data corresponding to the target device;
  identifying a plurality of directions of the target device based on the product type of the target device;
  obtaining a component weight and a direction weight corresponding to the at least one component based on the product type of the target device; and
  acquiring virtual object data for representing an appearance of the target device based on the at least one component, the plurality of directions, and the component weight, and the direction weight,
  wherein the component corresponds to a structural element in the target device, and the component weight corresponds to a weight set for the structural element in the target device.

* * * * *